United States Patent [19]
Inoue et al.

[11] Patent Number: 5,714,775
[45] Date of Patent: Feb. 3, 1998

[54] POWER SEMICONDUCTOR DEVICE

[75] Inventors: Tomoki Inoue, Tokyo; Ichiro Omura; Hiromichi Ohashi, both of Yokohama, all of Japan

[73] Assignee: Kabushiki Kaisha Toshiba, Kawasaki, Japan

[21] Appl. No.: 633,688

[22] Filed: Apr. 19, 1996

[30] Foreign Application Priority Data

Apr. 20, 1995 [JP] Japan .................................. 7-095500

[51] Int. Cl.⁶ .......................... H01L 29/74; H01L 31/111
[52] U.S. Cl. .......................... 257/139; 257/147; 257/149
[58] Field of Search .......................... 257/139, 143, 257/147, 149, 151, 153, 156

[56] References Cited

U.S. PATENT DOCUMENTS

| | | | |
|---|---|---|---|
| 4,752,818 | 6/1988 | Kushida et al. | 257/156 |
| 5,171,696 | 12/1992 | Hagino | 257/139 |
| 5,329,142 | 7/1994 | Kitagawa et al. | 257/147 |

FOREIGN PATENT DOCUMENTS

| | | |
|---|---|---|
| 61-56446 | 3/1986 | Japan . |
| 63-228710 | 9/1988 | Japan . |

*Primary Examiner*—Wael Fahmy
*Attorney, Agent, or Firm*—Oblon, Spivak, McClelland, Maier & Neustadt, P.C.

[57] ABSTRACT

A p-type emitter layer having a low resistivity is arranged on a bottom surface of an n-type base layer having a high resistivity. A p-type base layer is formed in a top surface of the n-type base layer. Trenches are formed in the p-type base layer and the n-type base layer such that each trench penetrates the p-type base layer and reaches down to a halfway depth in the n-type base layer. Inter-trench regions made of semiconductor are defined between the trenches. An n-type emitter layer having a low resistivity is formed in a surface of the p-type base layer to be in contact with the upper part of each trench. A gate electrode is buried via a gate insulating film in each trench. That side surface of each inter-trench region which faces the gate electrode consists of a $\{100\}$ plane.

22 Claims, 17 Drawing Sheets

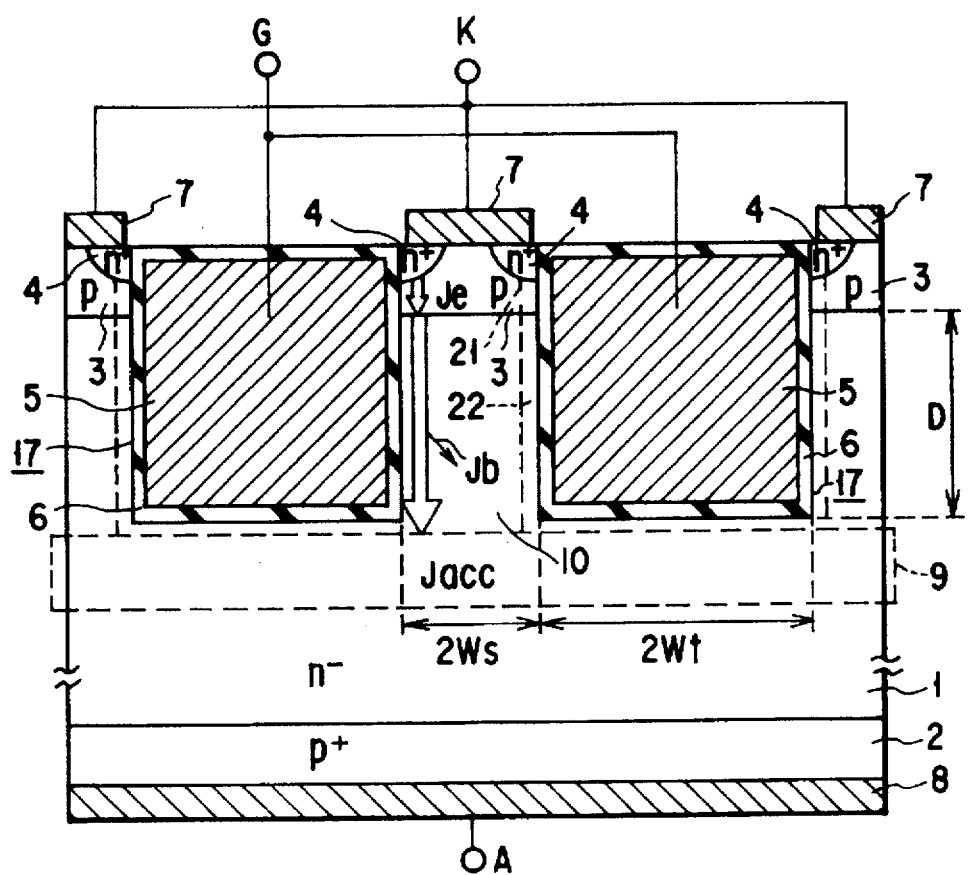
F I G. 1
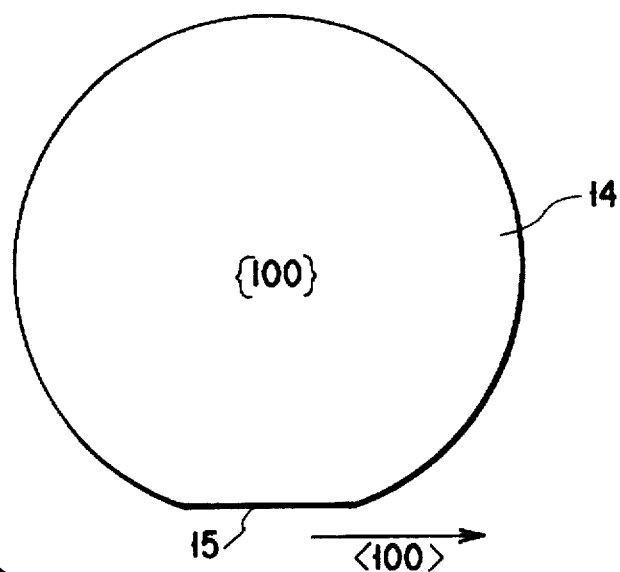
F I G. 2

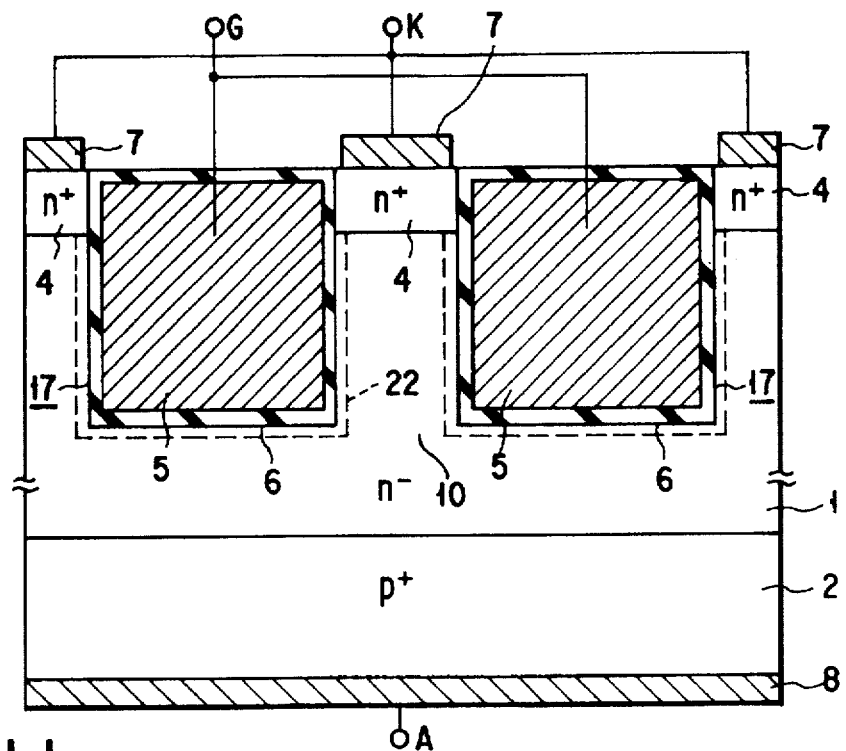
F I G. 11
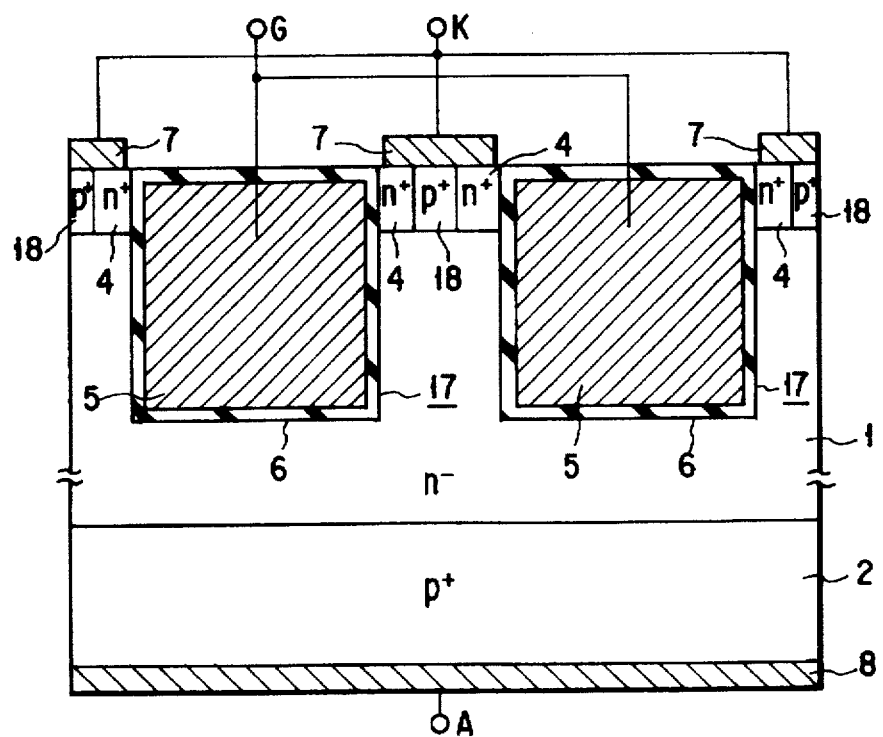
F I G. 12

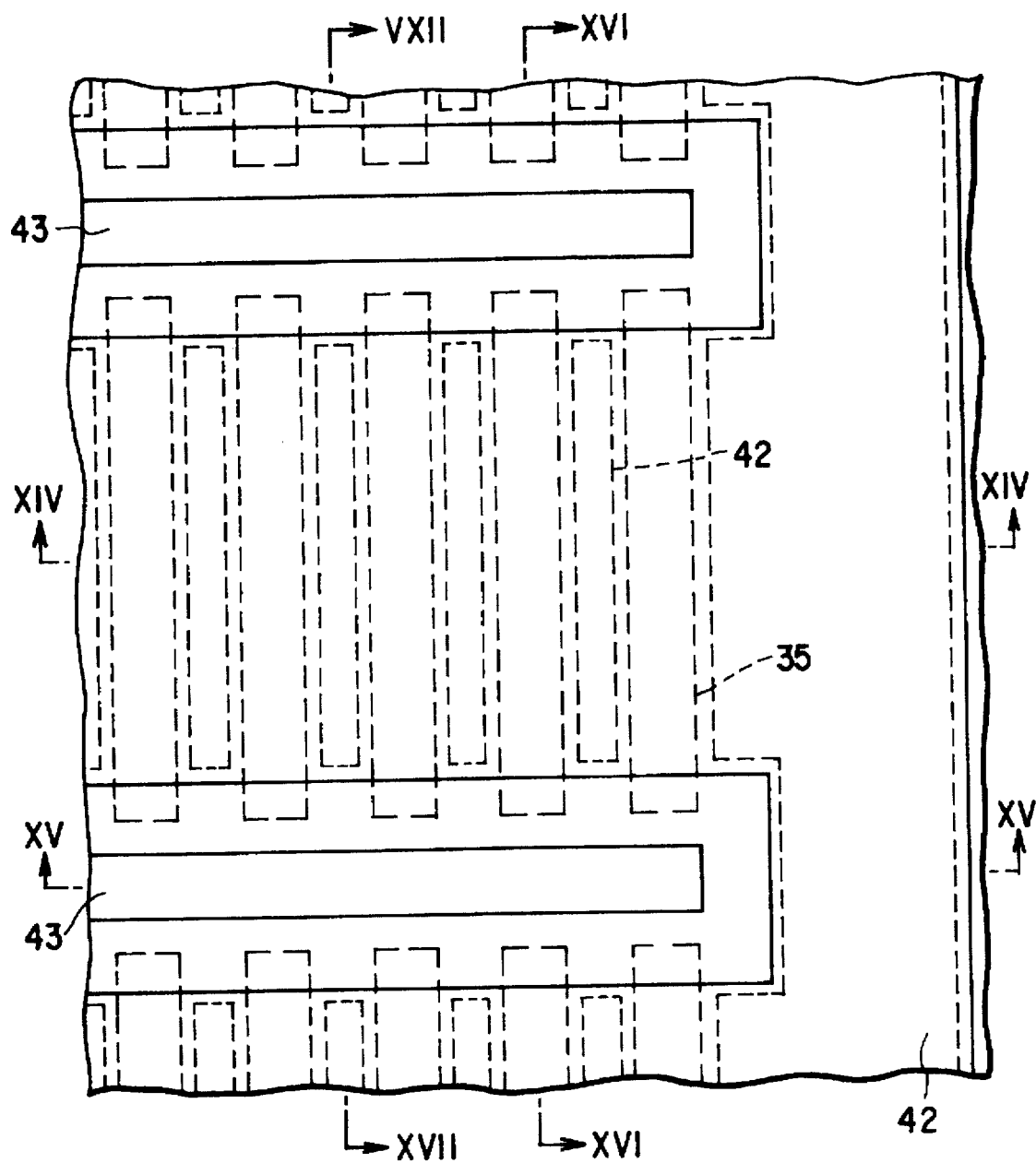
F I G. 13

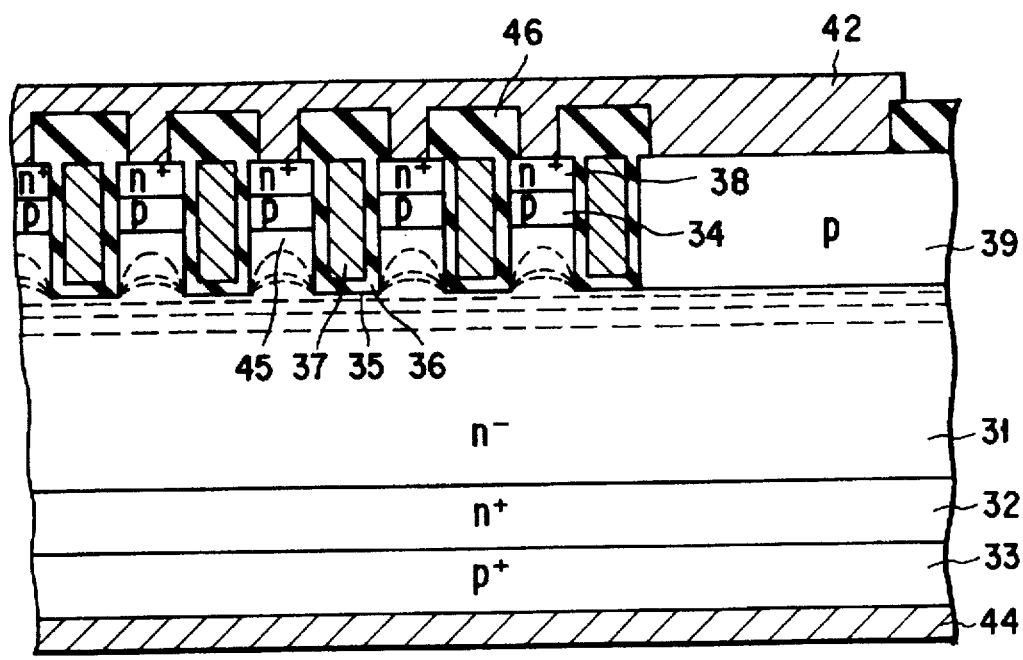
F I G. 14
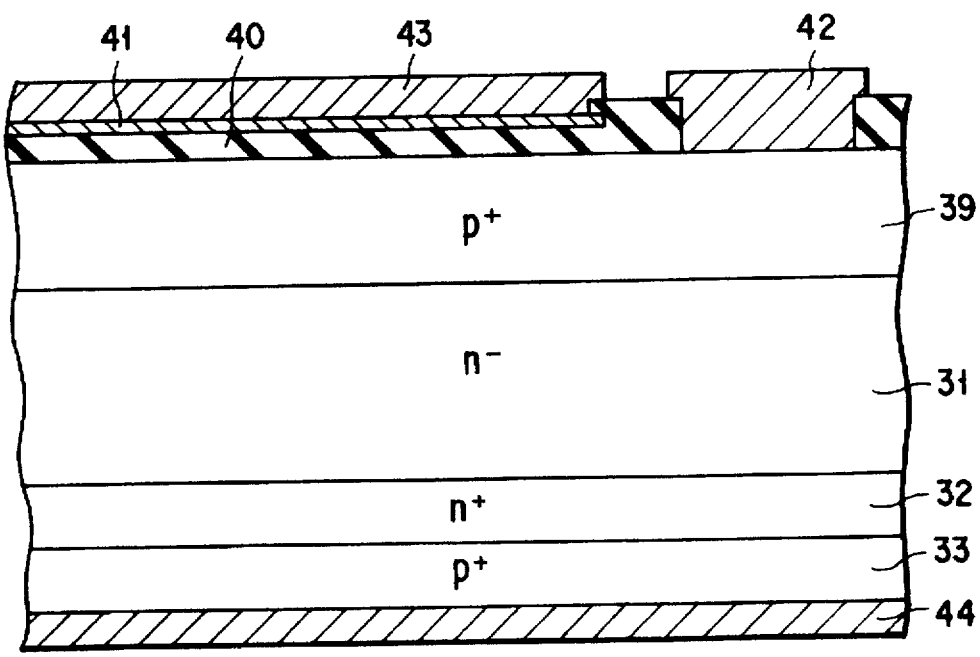
F I G. 15

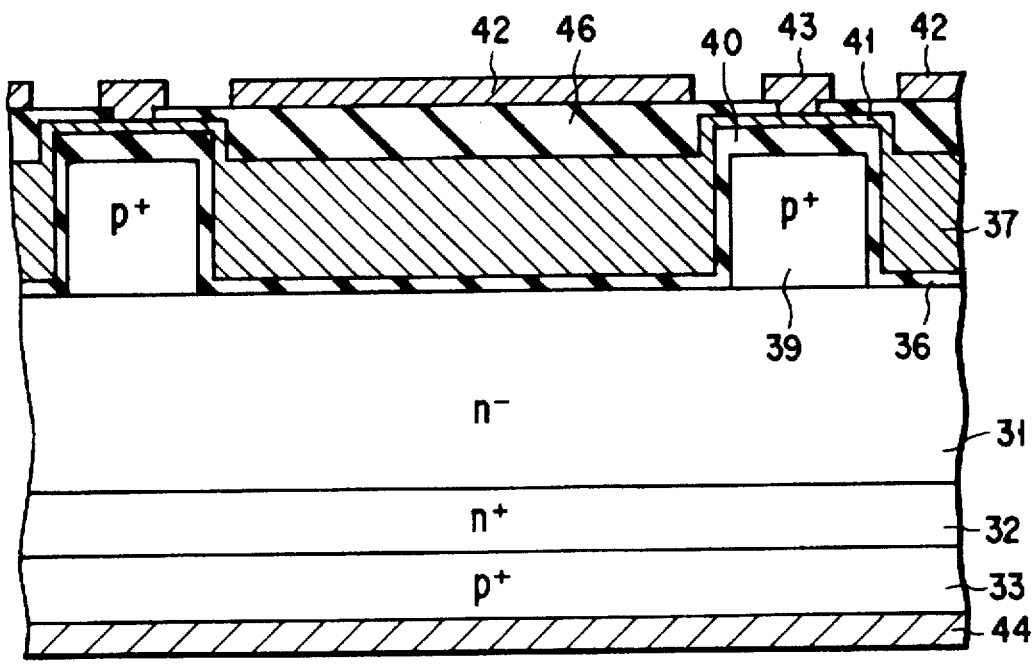
F I G. 16
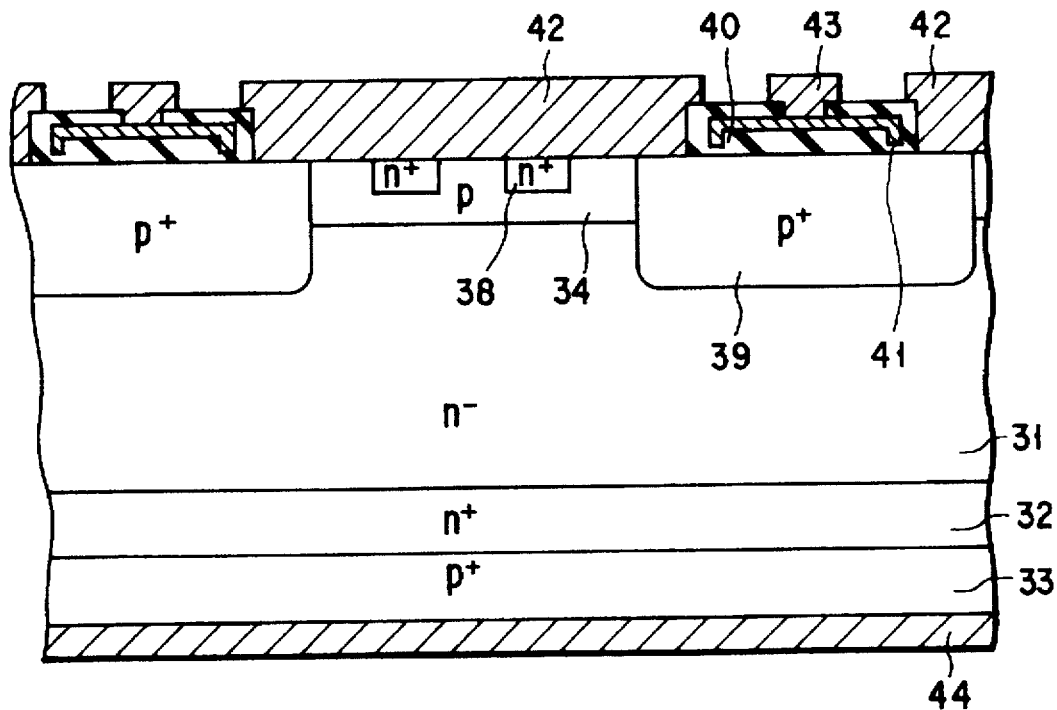
F I G. 17

POWER SEMICONDUCTOR DEVICE

BACKGROUND OF THE INVENTION

1. Field of the Invention

The present invention relates to a power semiconductor device for controlling a large electric power, specifically to a power semiconductor device having a buried insulated gate structure.

2. Description of the Related Art

A semiconductor device having a buried insulated gate structure, such as an insulated gate bipolar transistor (IGBT), is known as a device for power control.

FIG. 27 is a cross sectional view showing a conventional semiconductor device or IGBT having a buried insulated gate structure. FIG. 28 is a plan view showing a semiconductor substrate or wafer 92 used for manufacturing the semiconductor device shown in FIG. 27. The semiconductor substrate 92 has the main surface consisting of a {100} plane, and an orientation flat formed in a <110> direction.

As shown in FIG. 27, a p-type base layer 83 is formed in a surface of an n-type base layer 81 having a high resistivity. Trenches 97 are formed in the p-type base layer 83 and the n-type base layer 81 such that each trench 97 penetrates the p-type base layer 83 and reaches down to a halfway depth in the n-type base layer 81. The dominant orientation of the side wall surface of the trench 97 consists of a {110} plane.

This is because, the pattern of the trenches formed in the semiconductor substrate 92 is arranged in parallel or perpendicular to the orientation flat 93.

A gate electrode 85 is buried via a gate insulating film 86 in the trench 97. An n-type emitter layer 84 having a low resistivity is formed in a surface of the p-type base layer 83 to be in contact with an upper portion of the trench 97.

A cathode electrode 87 is arranged in contact with both the p-type base layer 83 and the n-type emitter layer 84. The cathode electrode 87 is insulated from the gate electrode 85. On the other hand, a p-type emitter layer 82 having a low resistivity is arranged on the bottom surface of the n-type base layer 81. An anode electrode 88 is arranged on the p-type emitter layer 82.

The device of the construction described above is operated as follows.

When the device is turned on, a voltage which is positive relative to the cathode, i.e., positive bias voltage, is applied to the gate electrode 85. If the positive bias voltage is applied to the gate electrode 85, an n-type channel is formed in the p-type base layer 83 and around the trench 97, so that short-circuiting takes place between the n-type emitter layer 84 and n-type base layer 81. At the same time, by the application of the positive bias voltage, an accumulation layer (not shown), in which electrons are accumulated, is formed in the n-type base layer 81 around the trench 97.

As a result, an electron current Je flows through the n-type channel into the n-type base layer 81, and holes are injected into the n-type base layer 81 from the p-type emitter layer 82 in an amount corresponding to the electron current Je. It follows that carriers are accumulated in the n-type base layer 81 and cause a conductivity modulation in the base layer 81, so that the resistivity of the n-type base layer 81 is lowered. In this manner, an electric current is caused to flow between the anode and cathode.

On the other hand, when the device is turned off, a voltage which is zero or negative, i.e., negative bias voltage, relative to the cathode is applied to the gate electrode 85. With this operation, the n-type channel disappears and, thus, electrons cease to be injected from the n-type emitter layer 84 into the n-type base layer 81. As a result, the conductivity modulation does not take place any more in the n-type base layer 81, so that the device is rendered non-conductive.

In such a conventional semiconductor device, however, there gives rise to problems as described below. Specifically, although an electron current Jacc, which is part of the electron current Je, flows in the accumulation layer, an electron current Jb, which is the majority of the electron current Je, flows, deviating from the accumulation layer. In this case, electrons separating from the accumulation layer disappear in an inter-trench region 90, due to recombination with holes supplied from the n-type base layer 81. Where electrons disappear before reaching a region 89 right under the trench 97, due to recombination of the electrons with holes, the amount of carriers to be accumulated in the region 89 decreases, thereby increasing conduction loss.

SUMMARY OF THE INVENTION

An object of the present invention is to provide a power semiconductor device, having a buried insulated gate structure, which permits lowering the conduction loss.

According to a first aspect of the present invention, there is provided a power semiconductor device comprising:

an emitter layer of a first conductivity type;

a base layer of a second conductivity type arranged on the emitter layer of the first conductivity type, and causing a conductivity modulation in an on-state of the device;

a base layer of the first conductivity type formed in a surface of the base layer of the second conductivity type;

a plurality of trenches penetrating the base layer of the first conductivity type and reaching down to a halfway depth in the base layer of the second conductivity type so as to define a plurality of current passages;

a gate electrode buried in each of the trenches via a gate insulating film;

an emitter layer of the second conductivity type formed in a surface of the base layer of the first conductivity type within each of the current passages;

a first main electrode connected to both the emitter layer of the second conductivity type and the base layer of the first conductivity type; and a second main electrode connected to the emitter layer of the first conductivity type, wherein each of the current passages has a side surface facing the gate electrode, in which a {100} plane is dominant, and wherein, in an on-state of the device, an accumulation layer containing accumulated carriers of the second conductivity type is formed in the side surface within the base layer of the second conductivity type, and carriers of the second conductivity type are injected into a region of the base layer of the second conductivity type under the trenches through the accumulation layer.

According to a second aspect of the present invention, there is provided a power semiconductor device comprising:

an emitter layer of a first conductivity type;

a base layer of a second conductivity type arranged on the emitter layer of the first conductivity type, and causing a conductivity modulation in an on-state of the device;

an emitter layer of the second conductivity type formed in a surface of the base layer of the second conductivity type;

a plurality of trenches penetrating the emitter layer of the second conductivity type and reaching down to a halfway depth in the base layer of the second conductivity type so as to define a plurality of current passages;

a gate electrode buried in each of the trenches via a gate insulating film;

a first main electrode connected to the emitter layer of the second conductivity type; and a second main electrode connected to the emitter layer of the first conductivity type, wherein each of the current passages has a side surface facing the gate electrode, in which a {100} plane is dominant, and wherein, in an on-state of the device, an accumulation layer containing accumulated carriers of the second conductivity type is formed in the side surface within the base layer of the second conductivity type, and carriers of the second conductivity type are injected into a region of the base layer of the second conductivity type under the trenches through the accumulation layer.

The present inventors have found that, in a conventional power semiconductor device having a buried insulated gate structure, as shown in FIG. 27, the reason as to why most of the electron current flows, separating from the accumulation layer, exists in the structure of the trench.

Specifically, the side wall surface of the conventional trench consists of a {110} plane, and provides an accumulation layer having a high resistivity. As a result, electrons are apt to move through part of the inter-trench region other than the accumulation layer, and disappear due to recombination with holes. It follows that the amount of carriers to be accumulated in the n-type base layer right under the trench becomes less, thereby increasing the conduction loss.

In contrast, where the side wall surface of the trench mainly consists of {100}, the resistivity of an accumulation is sufficiently low, so that most of the electrons move through the accumulation layer. In other words, according to the present invention on the basis of the findings, an accumulation layer formed along the side wall surface has a sufficiently low resistance. It follows that the amount of carriers to be accumulated in the n-type base layer, right under the trench on the first main or cathode electrode side, is increased, so that the conduction loss becomes lower than that of the conventional device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross sectional view showing a gist part of a power semiconductor device according to an embodiment of the present invention;

FIG. 2 is a plan view showing a semiconductor substrate used for manufacturing the semiconductor device shown in FIG. 1;

FIG. 11 is a cross sectional view showing a gist part of a power semiconductor device according to still another embodiment of the present invention;

FIG. 12 is a cross sectional view showing a gist part of a power semiconductor device according to still another embodiment of the present invention;

FIG. 13 is a plan view showing a gist part of a power semiconductor device according to still another embodiment of the present invention;

FIG. 14 is a cross sectional view taken along line XIV—XIV in FIG. 13;

FIG. 15 is a cross sectional view taken along line XV—XV in FIG. 13;

FIG. 16 is a cross sectional view taken along line XVI—XVI in FIG. 13;

FIG. 17 is a cross sectional view taken along line XVII—XVII in FIG. 13;

DETAILED DESCRIPTION OF THE PREFERRED EMBODIMENTS

Figure 3:
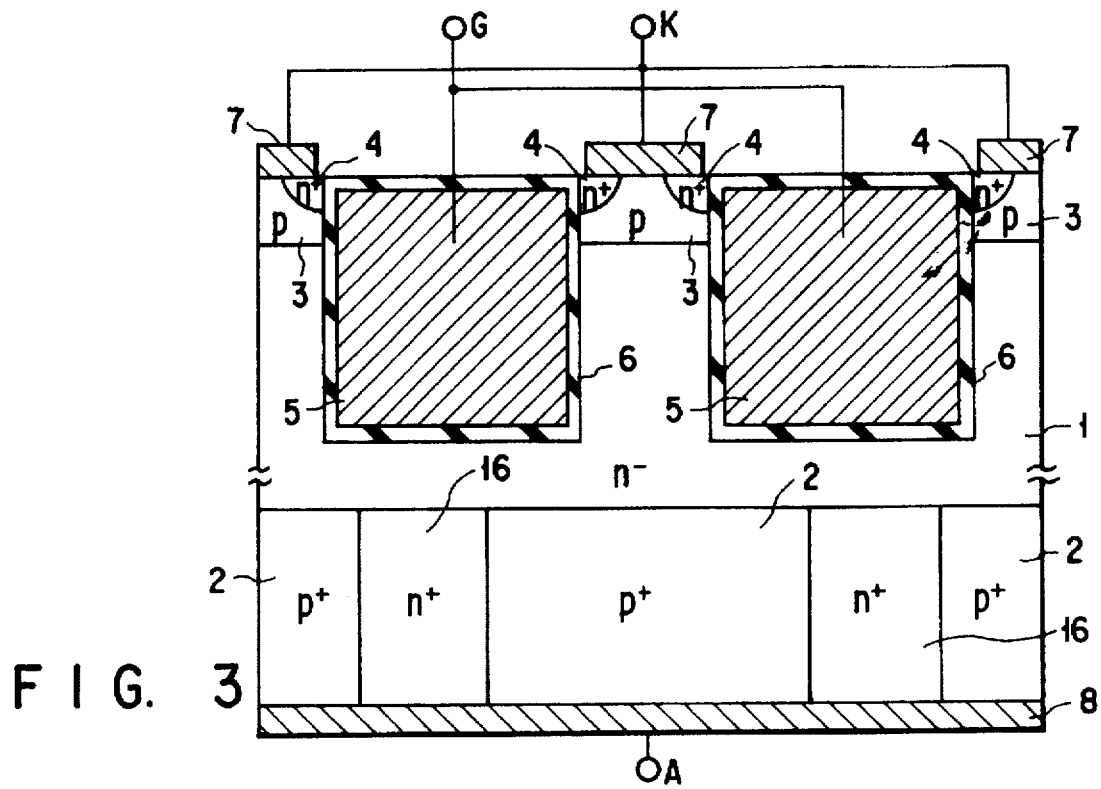
FIG. 3 is a cross sectional view showing a gist part of a power semiconductor device according to another embodiment of the present invention.

Let us describe some embodiments of the present invention with reference to the accompanying drawings. In the following description, a first conductivity type is p-type, and a second conductivity type is n-type.

FIG. 1 is a cross sectional view showing a gist part of a power semiconductor device according to an embodiment of the present invention. FIG. 2 is a plan view showing a semiconductor substrate 14 used for manufacturing the semiconductor device shown in FIG. 1. The semiconductor substrate 14 has the main surface consisting of a {100} plane, and an orientation flat formed in a <100> direction.

As shown in FIG. 1, a p-type emitter layer 2 having a low resistivity is arranged on a bottom surface of an n-type base layer 1 having a high resistivity. A p-type base layer 3 is formed in a top surface of the n-type base layer 1. It is desirable for the impurity concentration in the n-type base layer 1 to be $2 \times 10^{14} cm^{-3}$ or less.

Trenches 17 are formed in the p-type base layer 3 and the n-type base layer 1 such that each trench 17 penetrates the p-type base layer 3 and reaches down to a halfway depth in the n-type base layer 1. As a result, inter-trench regions 10 made of semiconductor, i.e., current passages, are defined between the trenches 17. A gate electrode 5 is buried via a gate insulating film 6 in the trench 17.

The trench 17 is formed to have a rectangular surface shape, i.e., rectangular shape in a plan view, in which the short sides are sufficiently short as compared to the long sides. The long sides are arranged in parallel or perpendicular to the orientation flat 15. In other words, the interface between the trench 17 and inter-trench region 10, corresponding to the long sides, is arranged to extend along a {100} plane. It should be noted that the trench 17 is not limited to ones having a rectangular surface shape, i.e., rectangular shape in a plan view. A trench having another shape may be used, on the condition that a {100} plane is dominant in the side surface of the inter-trench region 10, which faces the gate electrode 5.

An n-type emitter layer 4 having a low resistivity is formed in a surface of the p-type base region 3 to be in contact with the upper part of the trench 17. A cathode electrode 7 is arranged in contact with both the p-type base layer 3 and the n-type emitter layer 4. The cathode electrode 7 is insulated from the gate electrode 5. On the other hand, an anode electrode 8 is arranged in contact with the p-type emitter layer 2.

The semiconductor device shown in FIG. 1, having the construction described above, is operated as follows.

When the device is turned on, a voltage which is positive relative to the cathode, i.e., positive bias voltage, is applied to the gate electrode 5, while a voltage in which the anode is positive, i.e., forward bias voltage is applied between the anode and cathode. If the positive bias voltage is applied to the gate electrode 5, an n-type channel 21 is formed in the p-type base layer 3 and around the trench 17, so that short-circuiting takes place between the n-type emitter layer 4 and n-type base layer 1. At the same time, by the application of the positive bias voltage, an accumulation layer 22, in which electrons are accumulated, is formed in the n-type base layer 1 around the trench 17.

As a result, an electron current Je flows through the n-type channel 21 into the n-type base layer 1, and holes are injected into the n-type base layer 1 from the p-type emitter layer 2 in an amount corresponding to the electron current Je. It follows that carriers are accumulated in the n-type base layer 1 and cause a conductivity modulation in the base layer 1, so that the resistivity of the n-type base layer 1 is lowered. In this manner, an electric current is caused to flow between the anode and cathode.

As described above, in the semiconductor device shown in FIG. 1, a {100} plane is dominant in the side surface of the inter-trench region 10, which faces the gate electrode 5. As a result, the accumulation layer 22 has a sufficiently low resistivity, which is specifically about two thirds that of the conventional device in which a {110} plane is dominant in the side surface of the inter-trench region 90. It follows that an electron current Jb which flows separately from the accumulation layer 22 is sufficiently decreased.

In other words, with the semiconductor device shown in FIG. 1, the ratio of electrons flowing through the accumulation layer 22 is increased, as compared to the conventional device, so that electrons can efficiently reach a region 9 right under the trench 17 without being recombined with holes. As a result, the amount of carriers to be accumulated in the region 9 is increased, so that the conduction loss becomes lower than that of the conventional device.

It has experimentally been confirmed that the anode-cathode voltage of the semiconductor device shown in FIG. 1 under the conductive state is about 10% lower than that of the conventional device in which a {110} plane is dominant in the side surface of the inter-trench region. Further, it has experimentally been confirmed that, if the turn off time is controlled by electron irradiation, the anode-cathode voltage of the semiconductor device shown in FIG. 1 is about 15% lower than that of the conventional device.

When the device is turned off, a voltage which is zero or negative, i.e., negative bias voltage, relative to the cathode is applied to the gate electrode 5. With this operation, the n-type channel disappears and, thus, electrons cease to be injected from the n-type emitter layer 4 into the n-type base layer 1. As a result, the conductivity modulation does not take place any more in the n-type base layer 1, so that the device is rendered non-conductive.

In this non-conductive state, a depletion layer, from which carriers are exhausted, extends from a junction formed between the p-type base layer 3 and n-type base layer 1 and a potential gradient is generated in the depletion layer. Equi-potential planes in the depletion layer are almost parallel to the junction formed between the p-type base layer 3 and n-type base layer 1. However, the equi-potential planes are abruptly bent near the side wall of the trench 17 due to fixed charges and interface states existing in the interface between the trench 17 and inter-trench region 10, so that a electric field is higher, thereby increasing a leak current.

Particularly, in a power semiconductor device where the gate insulating film 6 has a relatively large thickness of 0.05 to 0.5 µm, the influence of the interface states is prominent while the influence of the fixed charges decrease, as compared a case where the gate insulating film 6 is thin. In such a case, if the interface between the trench 17 and inter-trench region 10 consists of a {100} plane, the interface states decrease, thereby decreasing a leak current, as compared to a case where the interface consists of a {110} plane.

It should be noted that, although the semiconductor device shown in FIG. 1 operates in an IGBT mode, it is possible for a device having substantially the same structure to operate in an IEGT (Injection-Enhanced Gate Transistor) mode, if parameters of the structure are set as follows.

Specifically, conditions of X=(Wt+D)/Ws, and X≧5 are satisfied, where D denotes the depth of that part of the trench 17 which is located in the n-type base layer 1, 2Ws denotes the distance between two adjacent trenches 17 or the width of the current passage, and 2Wt denotes the distance between two adjacent p-type base layers 3 or the distance between two adjacent current passages.

The IEGT mode operation is different from the IGBT mode operation in a point of carrier concentration profile in the n-type base layer 1. When the semiconductor device shown in FIG. 1 operates in an IGBT mode, the minimum point of the carrier concentration in n-type base layer 1 is close to the junction between the p-type base region 3 and the n-type base layer 1, and the carrier concentration increases as closer to the p-type emitter layer 2. On the other hand, when the semiconductor device operates in an IEGT mode, the carrier concentration near the bottom of the trench 17 is much higher than that of the IGBT mode device, so that the amount of carrier in the n-type base layer 1 increases. Therefore the on-state voltage drop of the IEGT mode device is much lower than that of the IGBT mode device.

FIG. 3 is a cross sectional view showing a gist part of a power semiconductor device according to another embodiment of the present invention. The reference numerals used commonly in FIG. 1 and the following drawings denote the same members and, thus, the explanation thereof is omitted in the following description.

The semiconductor device of this embodiment differs from the semiconductor device shown in FIG. 1 in that, in FIG. 3, part of the n-type base layer 1 is connected to the anode electrode 8 through an n-type anode shorting layer 16 having a low resistivity. In other words, an anode short circuit structure is employed in the semiconductor device of this embodiment.

In the semiconductor device shown in FIG. 3, electrons in that part of the n-type base layer 1 which is located on the anode side are exhausted to the anode electrode 8 through the n-type anode shorting layer 16. As a result, the amount of carriers accumulated in the anode side part of the n-type base layer 1 is decreased, thereby shortening the turn off time.

Figure 4:
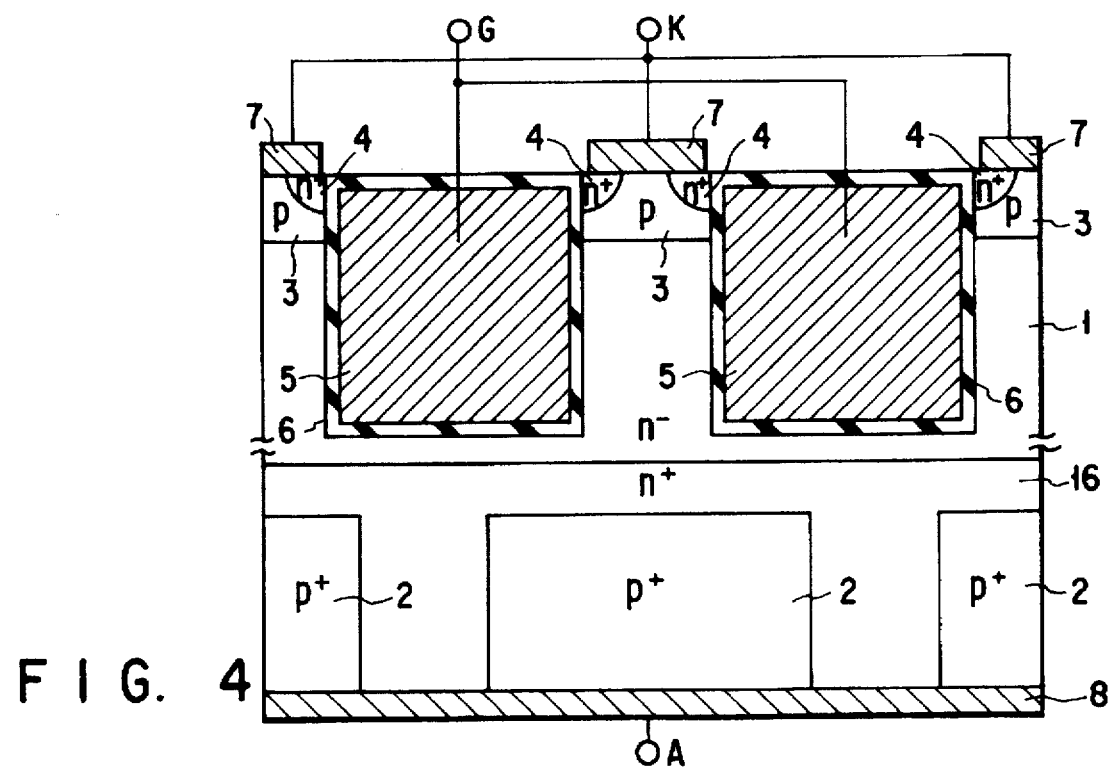
FIG. 4 is a cross sectional view showing a gist part of a power semiconductor device according to still another embodiment of the present invention.

It should be noted that, the n-type anode shorting layer 16 having a low resistivity may be formed to extend in the n-type base layer 1 beyond the p-type emitter layer 2, as shown in FIG. 4. By arranging the n-type anode shorting layer 16 between the p-type emitter layer 2 and n-type base layer 1, electrons and holes are recombined in the n-type anode shorting layer 16, so that the disappearance rate of electron-hole pairs is increased. As a result, holes are prevented from being injected from the p-type emitter layer 2 into the n-type base layer 1, so that the amount of carriers accumulated in the anode side part of the n-type base layer 1 is further decreased.

The structure shown in FIG. 4 is obtained by, e.g., selectively forming the p-type emitter layer 2 in a surface of the n-type anode shorting layer 16 by means of diffusion, after forming the n-type anode shorting layer 16 in a bottom surface of the n-type base layer 1 by means of diffusion.

Figure 5:
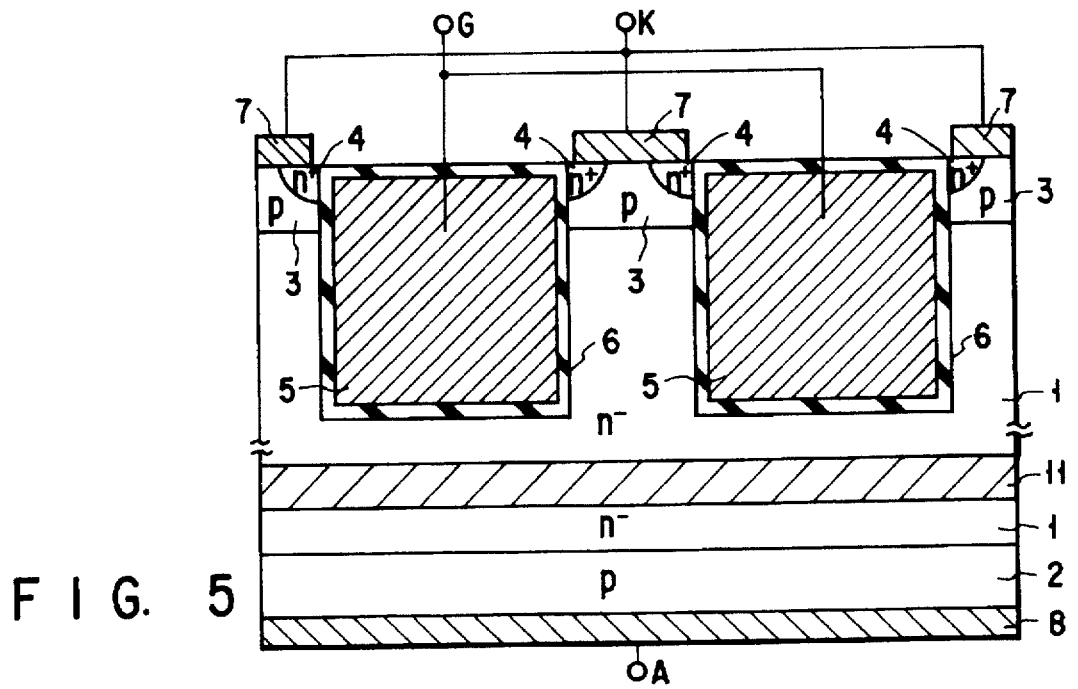
FIG. 5 is a cross sectional view showing a gist part of a power semiconductor device according to still another embodiment of the present invention.

FIG. 5 is a cross sectional view showing a gist part of a power semiconductor device according to still another embodiment of the present invention.

The semiconductor device of this embodiment differs from the embodiment of FIG. 1 in that, in FIG. 5, a low carrier lifetime layer 11 is formed in that part of the n-type base layer 1 which is located on the anode side.

In the semiconductor device shown in FIG. 5, the amount of carriers accumulated in the anode side part of the n-type base layer 1 is decreased by the low carrier lifetime layer 11. As a result, the turn off time is shortened, as in the devices shown in FIGS. 3 and 4.

Figure 6:
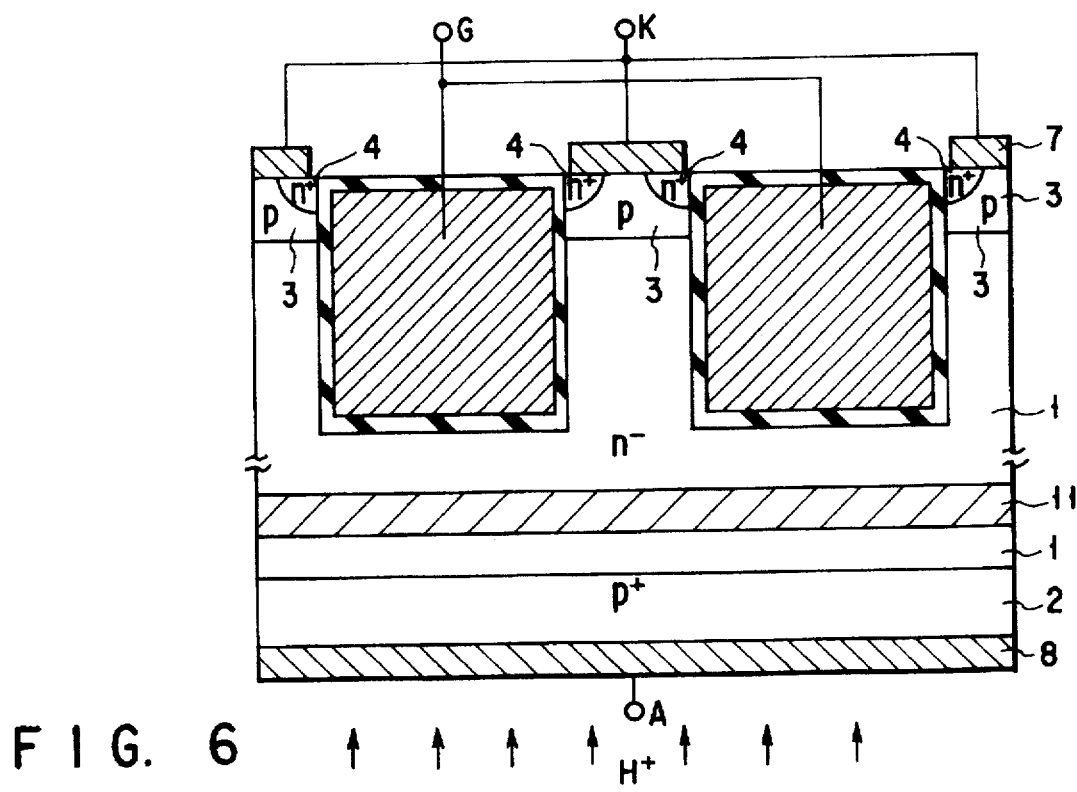
FIG. 6 is a cross sectional view for explaining a method of forming the low carrier lifetime layer of the semiconductor device shown in FIG. 5.

The low carrier lifetime layer 11 is formed by, e.g., irradiation with positive ions of proton $H^+$ from the anode side, as shown in FIG. 6. Although the proton $H^+$ is radiated onto the completed device structure in FIG. 6, the proton $H^+$ may be radiated onto a semi-finished device structure, so as to form the low carrier lifetime layer 11.

Figure 7:
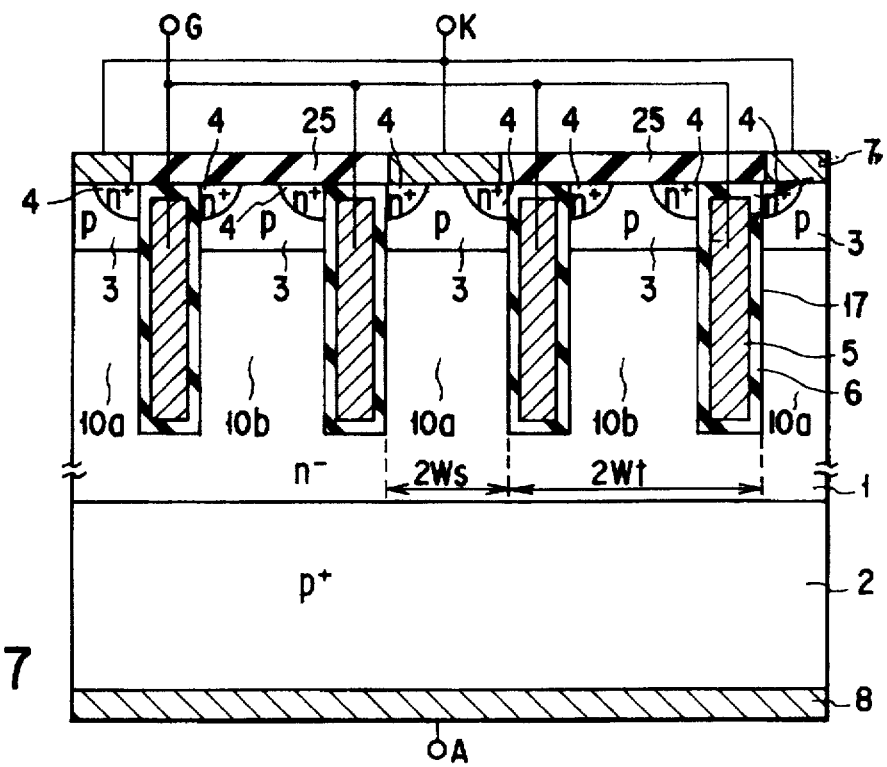
FIG. 7 is a cross sectional view showing a gist part of a power semiconductor device according to still another embodiment of the present invention.

FIG. 7 is a cross sectional view showing a gist part of a power semiconductor device according to still another embodiment of the present invention.

The semiconductor device of this embodiment differs from the embodiment of FIG. 1 in that, in FIG. 7, the cathode electrode 7 is arranged so as not to be in contact with all the inter-trench regions 10, but to be in contact with those of the inter-trench regions 10, which are periodically selected. Specifically, inter-trench regions 10a and dummy inter-trench regions 10b are alternately arranged. The inter-trench regions 10a are arranged in contact with the cathode electrode 7 and work as current passages, while the dummy inter-trench regions 10b are covered with an insulating film 25 and do not work as current passages. In each of the inter-trench regions 10a and 10b, the n-type emitter layer 4 is selectively formed. The cathode electrode 7 is arranged in contact with both the p-type base layer 3 and the n-type emitter layer 4.

In the semiconductor device shown in FIG. 7, no current flows in the dummy inter-trench regions 10b which is out of contact with the cathode electrode 7, so that the dummy inter-trench regions substantially function as part of the trenches. As a result, the effective area of the p-type base layer 3 is reduced, so as to increase resistance for preventing holes, accumulated in that part of the n-type base layer 1 which is located on the cathode side, from being exhausted to the cathode electrode 7. It follows that the amount of carriers to be accumulated in the cathode side part of the n-type base layer 1 is increased, thereby further lowering the conduction loss.

In a case where the semiconductor device shown in FIG. 7 is operated in an IGBT mode, it is necessary to satisfy conditions of X=(Wt+D)/Ws, and X≧5, where D denotes the depth of that part of the trench 17 which is located in the n-type base layer 1, 2Ws denotes the distance between the {100} side surfaces of the inter-trench region 10a or the width of the current passage, and 2Wt denotes the distance between two adjacent inter-trench regions 10a or two adjacent current passages.

Figure 8:
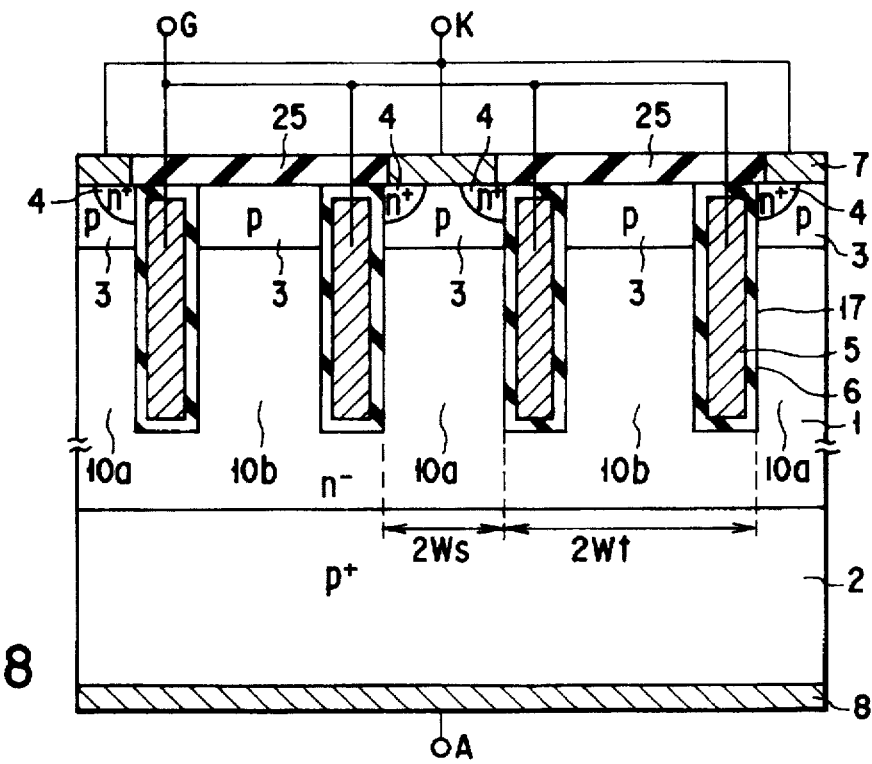
FIG. 8 is a cross sectional view showing a gist part of a power semiconductor device according to still another embodiment of the present invention.

The n-type emitter layer 4 may be formed of a plurality of regions which extend in the p-type base layer 3 so as to bridge the part between two adjacent trenches 17. Further, as shown in FIG. 8, it is possible to obtain effects the same as those in the device shown in FIG. 7 by forming the n-type emitter layer 4 only in the inter-trench regions 10a, but not in the dummy inter-trench regions 10b.

Figure 9:
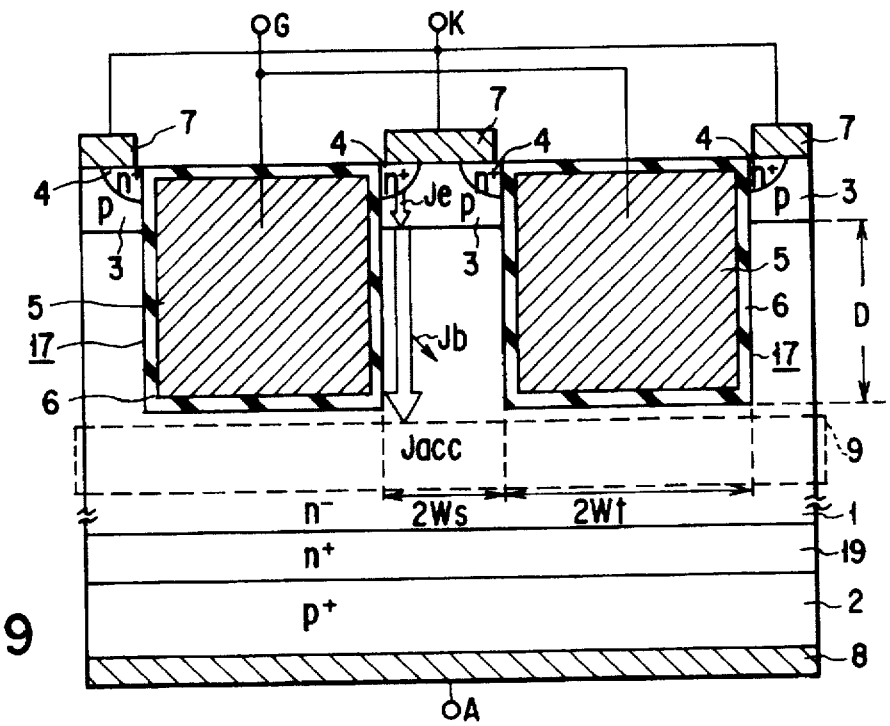
FIG. 9 is a cross sectional view showing a gist part of a power semiconductor device according to still another embodiment of the present invention.

FIG. 9 is a cross sectional view showing a gist part of a power semiconductor device according to still another embodiment of the present invention.

The semiconductor device of this embodiment differs from the embodiment of FIG. 1 in that, in FIG. 9, an n-type buffer layer 19 having a low resistivity is arranged between the n-type base layer 1 and p-type emitter layer 2.

Figure 10:
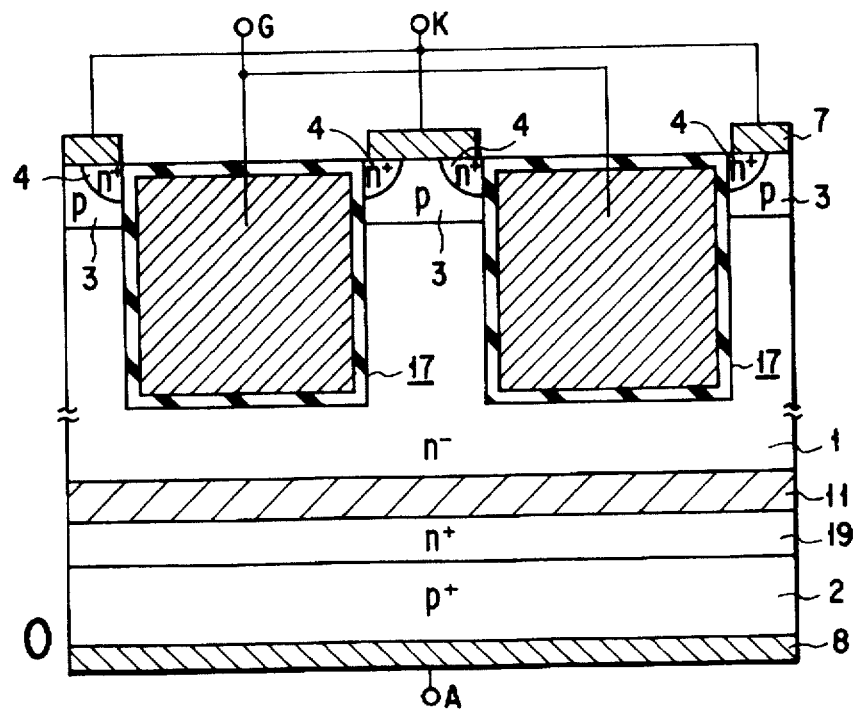
FIG. 10 is a cross sectional view showing a gist part of a power semiconductor device according to still another embodiment of the present invention.

FIG. 10 is a cross sectional view showing a gist part of a power semiconductor device according to still another embodiment of the present invention.

The semiconductor device of this embodiment differs from the embodiment of FIG. 5 in that, in FIG. 10, the n-type buffer layer 19 having a low resistivity is arranged between the low carrier lifetime layer 11 and p-type emitter layer 2.

FIG. 11 is a cross sectional view showing a gist part, i.e., power diode, of a power semiconductor device according to still another embodiment of the present invention.

As shown in FIG. 11, a p-type emitter layer 2 having a low resistivity is arranged on a bottom surface of an n-type base layer 1 having a high resistivity. An n-type emitter layer 4 having a low resistivity is formed in a top surface of the n-type base layer 1. It is desirable for the impurity concentration in the n-type base layer 1 to be $2 \times 10^{14} \text{cm}^{-3}$ or less.

Trenches 17 are formed in the n-type emitter layer 4 and the n-type base layer 1 such that each trench 17 penetrates the n-type emitter layer 4 and reaches down to a halfway depth in the n-type base layer 1. As a result, inter-trench regions 10 made of semiconductor, i.e., current passages, are defined between the trenches 17.

A gate electrode 5 is buried via a gate insulating film 6 in the trench 17. A cathode electrode 7 is arranged in contact with the n-type emitter layer 4 and is insulated from the gate electrode 5. On the other hand, an anode electrode 8 is arranged in contact with the p-type emitter layer 2.

As in the semiconductor devices shown in FIGS. 1 to 10, the semiconductor device shown in FIG. 11 is also manufactured, using a semiconductor substrate as shown in FIG. 2. The trench 17 is formed to have a rectangular surface shape, i.e., rectangular shape in a plan view, in which the short sides are sufficiently short as compared to the long sides. The long sides are arranged in parallel or perpendicular to the orientation flat 15. In other words, the interface between the trench 17 and inter-trench region 10, corresponding to the long sides, is arranged to extend along a {100} plane. It should be noted that the trench 17 is not limited to ones having a rectangular surface shape, i.e., rectangular shape in a plan view. A trench having another shape may be used, on the condition that a {100} plane is dominant in the side surface of the inter-trench region 10, which faces the gate electrode 5.

The semiconductor device shown in FIG. 11, having the construction described above, is operated as follows.

When the device is turned on, a voltage in which the anode is positive, i.e., forward bias voltage is applied between the anode and cathode. Under this condition, if the gate electrode 5 has a potential equal to that of the cathode, holes and electrons are injected into the n-type base layer 1 from the p-type emitter layer 2 and n-type emitter layer 4, respectively. As a result, carriers are accumulated in the n-type base layer 1, so that the resistivity of the n-type base layer 1 is lowered and the device is rendered conductive.

In addition, if a positive bias voltage is applied to the gate electrode 5, an accumulation layer 22, in which electrons are accumulated, is formed around the trench 17. It follows that the electron injection from the n-type emitter layer 4 into the n-type base layer 1 is performed substantially through the accumulation layer 22. On the other hand, holes accumulated in the n-type base layer 1 are exhausted to the cathode through narrow regions between the trenches 17. As a result, resistance against the hole exhaustion is increased, so that carriers are apt to be accumulated in that part of the n-type base layer 1 which is located right under the trench 17, thereby further lowering the conduction loss.

When the device shown in FIG. 11 is turned off, a voltage which is zero or a reverse bias voltage is applied between the anode and cathode. With this operation, holes and electrons cease to be injected from the p-type emitter layer 2 and the n-type emitter layer 4, respectively, into the n-type base layer 1. As a result, the conductivity modulation does not take place any more in the n-type base layer 1, so that the device is rendered non-conductive.

While a forward bias voltage is applied between the anode and cathode, the device shown in FIG. 11 can be turned off by applying a voltage which is negative relative to the cathode, i.e., a negative bias voltage, to the gate electrode 5. With this operation, depletion layers extending from the side wall surfaces of two adjacent trenches 17 are brought into contact with each other and pinch off electrons injected from the n-type emitter layer 4, so that the device is rendered non-conductive.

The gate electrode 5 may be arranged on the anode side, other than cathode side, as a modification of the semiconductor device shown in FIG. 11. A buried insulated gate electrode similar to the gate electrode 5 may be arranged on the anode side, in addition to the gate electrode 5 arranged on the cathode side. In those modifications, effects similar to those described above can be attained by applying a bias voltage, which is negative relative to the anode electrode 8, to the anode-side gate electrode.

As shown in FIG. 12, a p-type shorting layer 18 having a low resistivity may be formed in the n-type emitter layer 4 so as to be in contact with both the cathode electrode 7 and the n-type base layer 1. The p-type shorting layer 18 may be formed of a plurality of regions which extend in the n-type emitter layer 4 so as to bridge the part between two adjacent trenches 17.

The n-type buffer layer 19 having a low resistivity shown in FIG. 9 may be arranged between the n-type base layer 1 and p-type emitter layer 2 in the devices shown in FIGS. 11 and 12.

FIG. 13 is a plan view showing a gist part of a power semiconductor device according to still another embodiment of the present invention. FIGS. 14, 15, 16, and 17 are cross sectional views taken along line XIV—XIV, line XV—XV, line XVI—XVI, and line XVII—XVII, respectively, in FIG. 13.

As shown in the drawings, a p-type emitter layer 33 having a low resistivity is arranged, via an n-type buffer layer 32 having a low resistivity, on a bottom surface of an n-type base layer 31 having a high resistivity. A p-type base layer 34 is formed in a top surface of the n-type base layer 31 by diffusion. It is desirable for the impurity concentration in the n-type base layer 31 to be $2 \times 10^{14} \text{cm}^{-3}$ or less.

Trenches 35 are formed in the p-type base layer 34 and the n-type base layer 31 such that each trench 35 penetrates the p-type base layer 34 and reaches down to a halfway depth in the n-type base layer 31. The trenches 35 are arranged to form stripes which are parallel at small intervals. As a result, inter-trench regions 45 made of semiconductor, i.e., current passages, are defined between the trenches 35. A gate electrode 37 is buried via a gate insulating film 36 in the trench 35.

The trench 35 is formed to have a rectangular surface shape, i.e., rectangular shape in a plan view, in which the short sides are sufficiently short as compared to the long sides. The long sides are arranged in parallel or perpendicular to the orientation flat 15 (see FIG. 2). In other words, the interface between the trench 35 and inter-trench region 45, corresponding to the long sides, is arranged to extend along a {100} plane. It should be noted that the trench 35 is not limited to ones having a rectangular surface shape, i.e., rectangular shape in a plan view. A trench having another shape may be used, on the condition that a {100} plane is dominant in the side surface of the inter-trench region 45, which faces the gate electrode 37.

An n-type emitter layer 38 having a low resistivity is formed in a surface of the p-type base region 34. A p-type ring layer 39 having a low resistivity and the same depth as the trenches 35 is formed in the n-type base layer 31 so as to surround a group of trenches 35. The group consists of, e.g., 500 to 2000 trenches 35. On that region of the p-type ring layer 39 which extends in a direction perpendicular to the long sides of the trench 35, a gate lead-out electrode 41 is arranged via a thick insulating film 40. The gate lead-out electrode 41 is arranged in contact with the gate electrodes 47 at end portions of the trenches 35.

A cathode electrode 42 is arranged in contact with both the p-type base layer 34 and the n-type emitter layer 38. The cathode electrode 42 is insulated from the gate electrode 37 by a thick insulating film 46. A resistance-lowering electrode 43 is arranged on and in contact with the gate lead-out electrode 41. The resistance-lowering electrode 43 is formed of a thin film made of a metal, such as Al. The cathode electrode 42 and the resistance-lowering electrode 43 are arranged on different regions so as to be insulated from each other. Further, an anode electrode 44 is arranged in contact with the p-type emitter layer 33.

The p-type ring layer 39 has a carrier concentration high enough not to be depleted by a voltage applied between the anode and cathode when the semiconductor device is in an off-state. To be exact, it is desirable for the impurity concentration in the p-type ring layer 39 to be $1 \times 10^{17} \text{cm}^{-3}$ or more.

In the semiconductor device shown in FIGS. 13 to 17, the n-type emitter layer 38 is formed in that entire surface of the p-type base layer 34 which is located in the inter-trench region 45. The n-type emitter layer 38 may be formed partly in the inter-trench region 45 so as to extend along each long side of the trench 35 and in contact therewith, as shown in FIG. 1. In this case, the p-type base layer 34 is brought into contact with the cathode electrode 42 between two adjacent n-type emitter layers 38.

In an off-state of the semiconductor device shown in FIGS. 13 to 17, i.e., a state where the cathode electrode 42 is grounded and a voltage lower than the threshold voltage is applied to the gate electrode 37, if a certain positive voltage is applied to the anode electrode 44, the potential distribution in the n-type base layer 31 near the trenches 35 is rendered as indicated by the broken lines in FIG. 14. As shown in FIG. 14, due to the p-type ring layer 39, equipotential lines become linear at the bottom corners of the trenches 35, thereby relaxing electric concentration. It follows that the breakdown voltage of the semiconductor device is prevented from being deteriorated.

Figure 18:
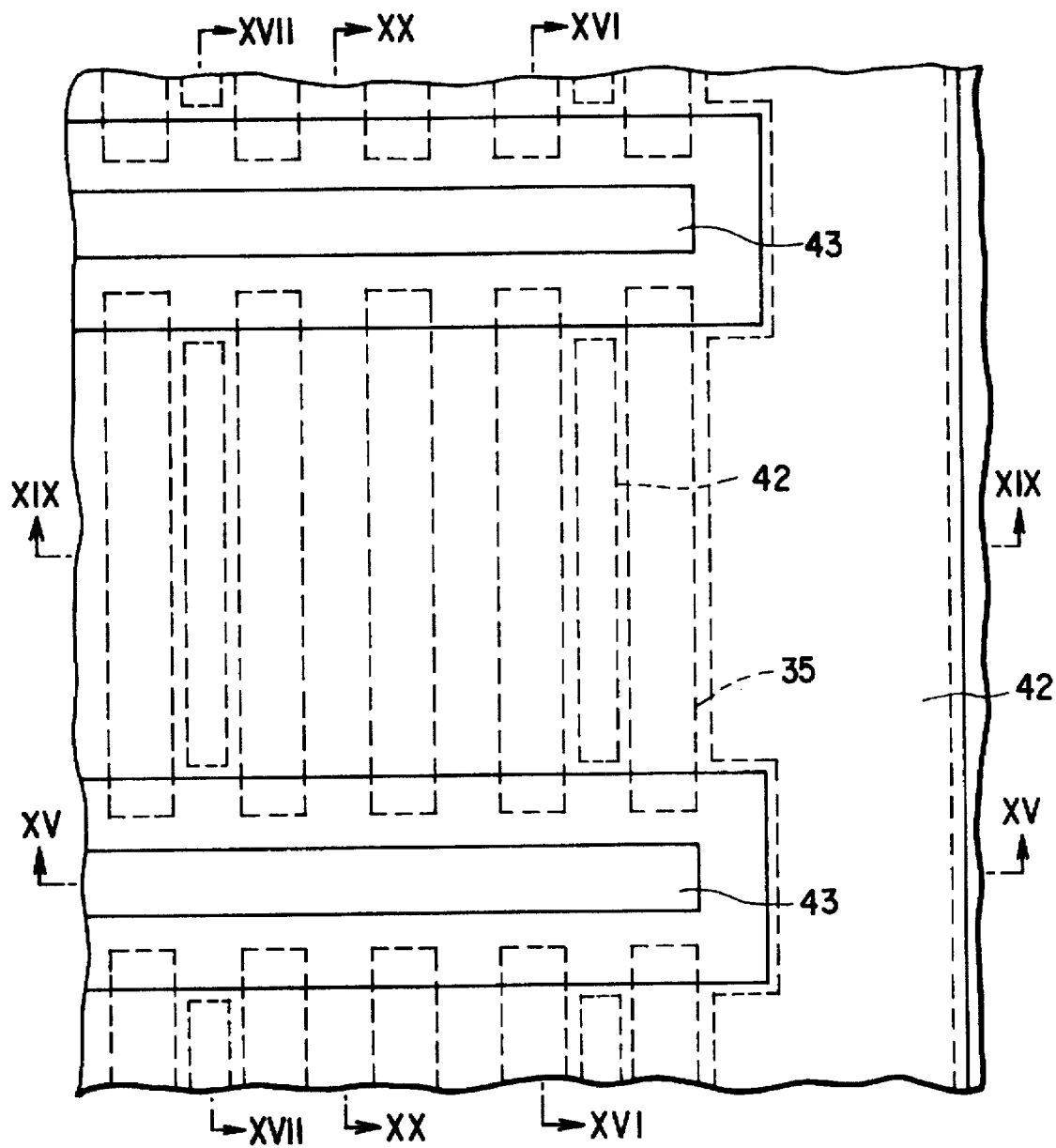
FIG. 18 is a plan view showing a gist part of a power semiconductor device according to still another embodiment of the present invention.
Figure 19:
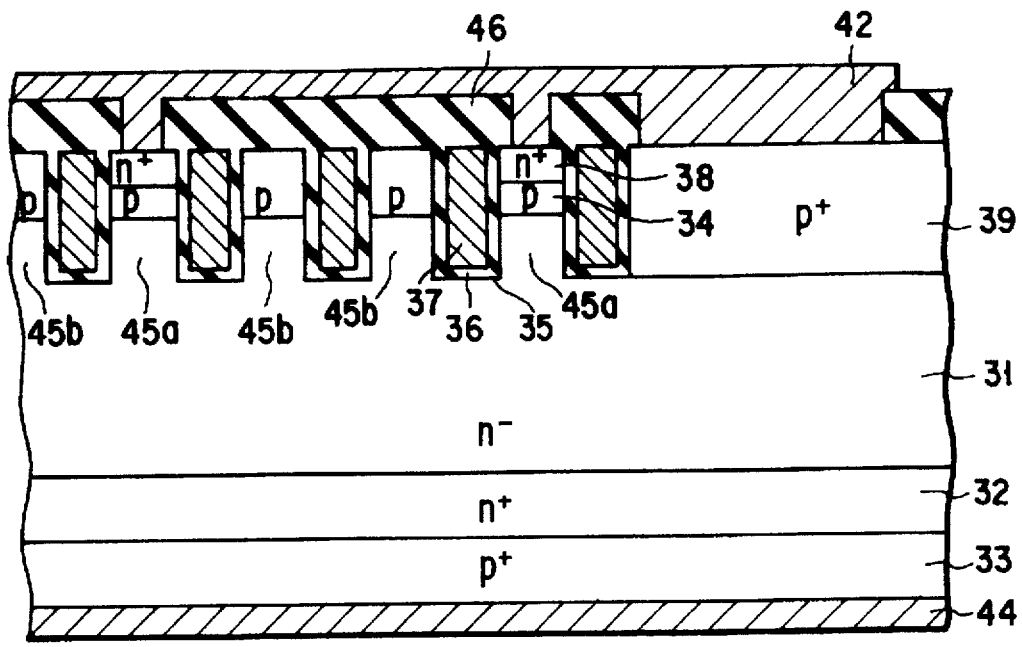
FIG. 19 is a cross sectional view taken along line XIX—XIX in FIG. 18.
Figure 20:
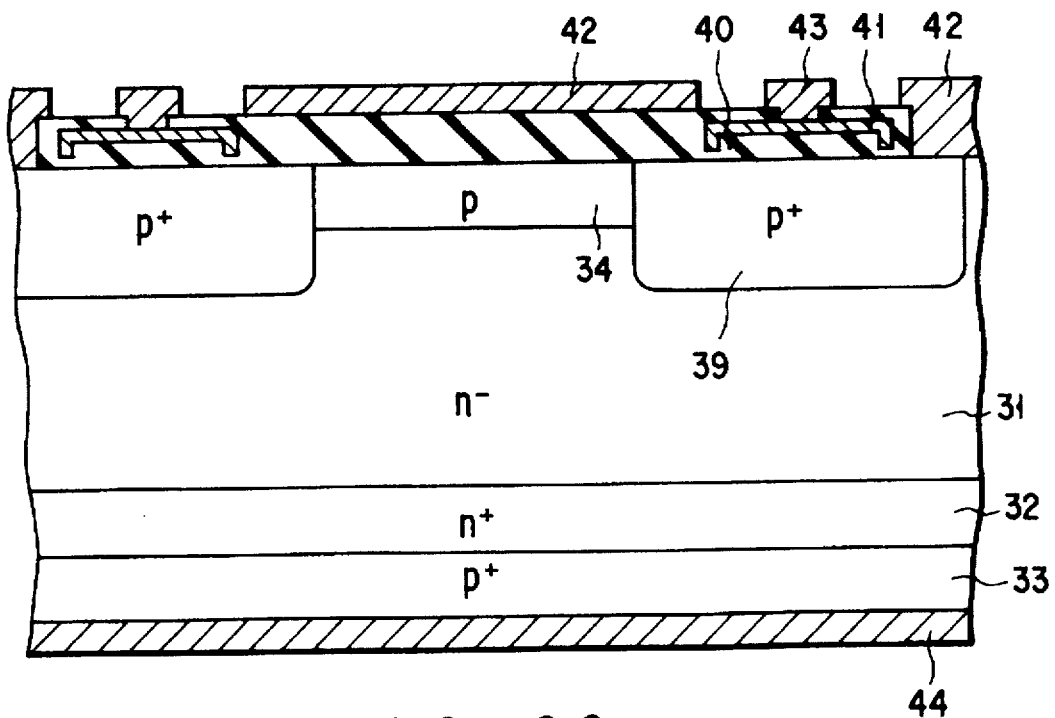
FIG. 20 is a cross sectional view taken along line XX—XX in FIG. 18.

FIG. 18 is a plan view showing a gist part of a power semiconductor device according to still another embodiment of the present invention. FIGS. 19 and 20 are cross sectional views taken along line XIX—XIX and line XX—XX, respectively, in FIG. 18. The cross sectional views taken along line XV—XV, line XVI—XVI and line XVII—XVII in FIG. 18 are substantially the same as those shown in FIGS. 15, 16 and 17, respectively. The reference numerals used commonly in FIGS. 13 to 17 and the following drawings denote the same members and, thus, the explanation thereof is omitted in the following description.

The semiconductor device of this embodiment differs from the semiconductor device shown in FIGS. 13 to 17 in that, in FIGS. 18 to 20, the cathode electrode 42 is arranged so as not to be in contact with all the inter-trench regions 45, but to be in contact with those of the inter-trench regions 45, which are periodically selected. Specifically, inter-trench regions 45a and dummy inter-trench regions 45b are alternately arranged. The inter-trench regions 45a are arranged in contact with the cathode electrode 42 and work as current passages, while the dummy inter-trench regions 45b are covered with an insulating film 46 and do not work as current passages.

In the semiconductor device shown in FIGS. 18 to 20, no current flows in the dummy inter-trench regions 45b which is out of contact with the cathode electrode 42, so that the dummy inter-trench regions substantially function as part of the trenches. As a result, the effective area of the p-type base layer 34 is reduced, so as to increase resistance for preventing holes, accumulated in that part of the n-type base layer 31 which is located on the cathode side, from being exhausted to the cathode electrode 42. It follows that the amount of carriers to be accumulated in the cathode side part of the n-type base layer 31 is increased, thereby further lowering the conduction loss.

Figure 21:
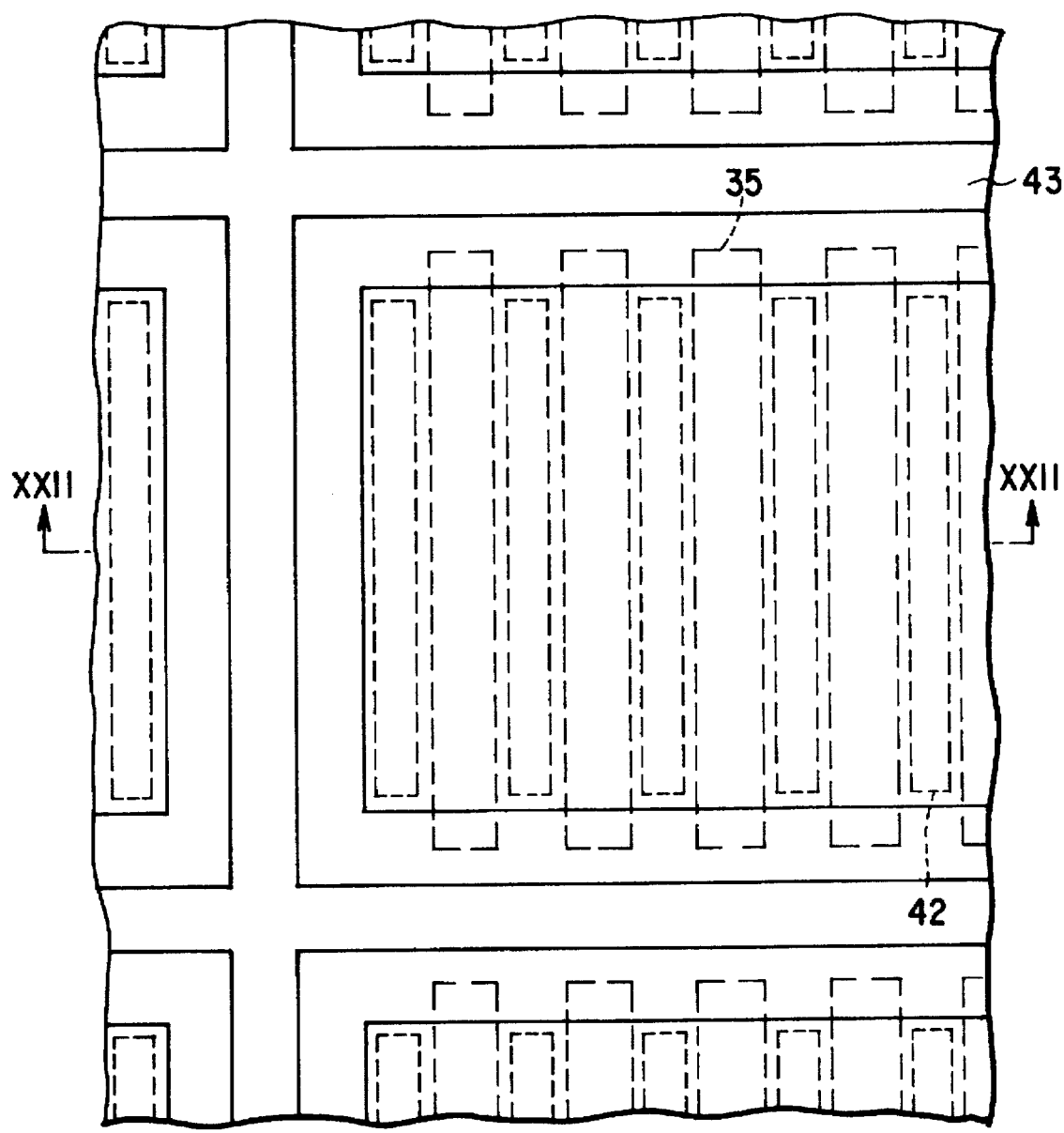
FIG. 21 is a plan view showing a gist part of a power semiconductor device according to still another embodiment of the present invention.
Figure 22:
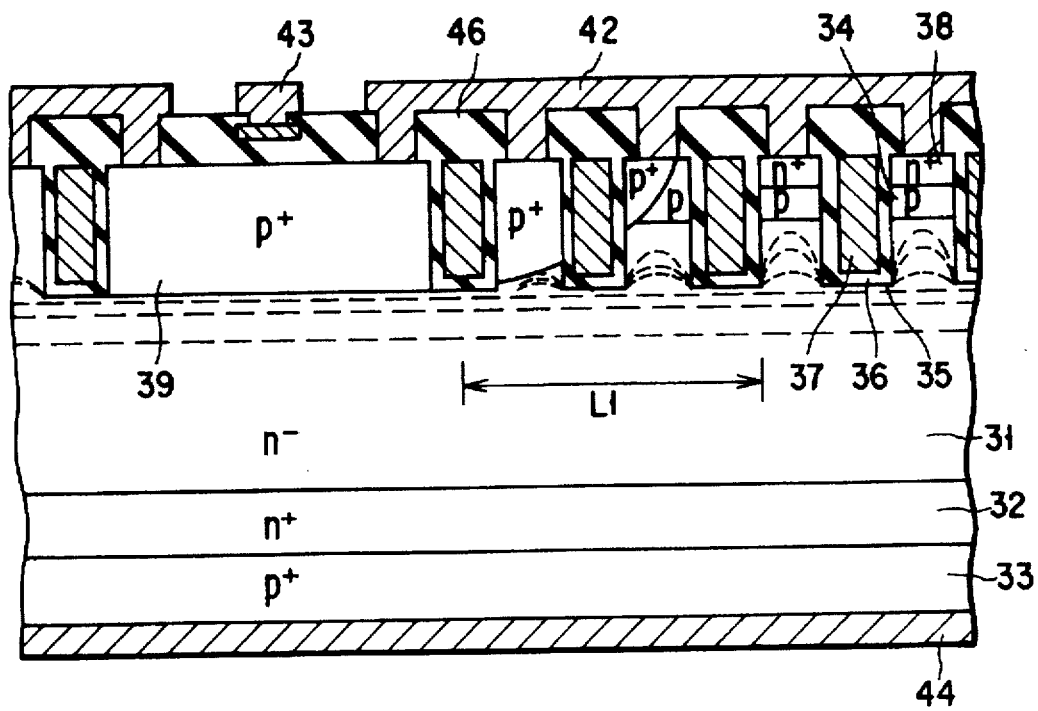
FIG. 22 is a cross sectional view taken along line XXII—XXII in FIG. 21.

FIG. 21 is a plan view showing a gist part of a power semiconductor device according to still another embodiment of the present invention. FIG. 22 is a cross sectional view taken along line XXII—XXII in FIG. 21.

The semiconductor device of this embodiment differs from the semiconductor device shown in FIGS. 13 to 17 in that, in FIGS. 21 and 22, the trenches 35 are formed after the p-type ring layer 39 is formed by diffusion. As a result, a p-type impurity diffuses laterally and the p-type ring layer 39 expands up to a region in which the trenches 35 are to be formed.

In this structure, the n-type emitter layer 38 should not be formed in those of the inter-trench regions 45 which are not distant from the pattern edge of the p-type ring layer 39 by a length L1 longer than the lateral diffusion length, so that latch-up current, at and above which the device is latched up, can be set at a high value.

Taking the lateral diffusion of the p-type impurity into consideration beforehand, the pattern edge of the p-type ring layer 39 may be set back from the outer side of the trenches 35 by a length L2 shorter than the width of each trench 35.

Figure 23:
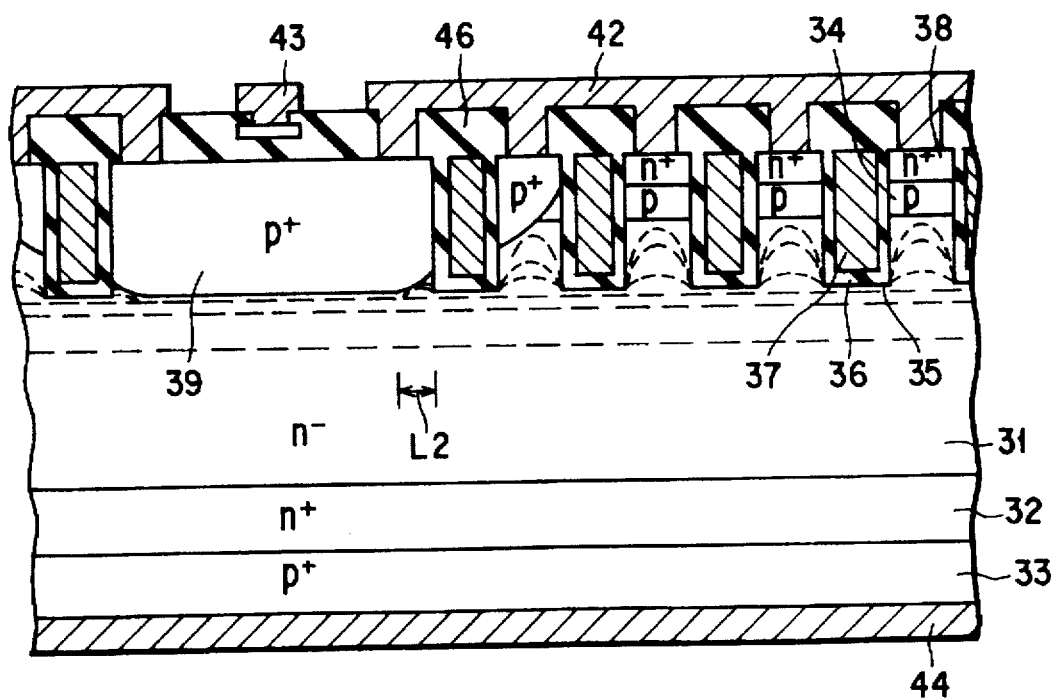
FIG. 23 is a cross sectional view showing a gist part of a power semiconductor device according to still another embodiment of the present invention.

When a certain positive voltage is applied to the anode electrode 44 in an off-state of the semiconductor devices shown in FIGS. 22 and 23, the potential distributions in the n-type base layer 31 near the trenches 35 are rendered as indicated by the broken lines in FIGS. 22 and 23, respectively.

Figure 24:
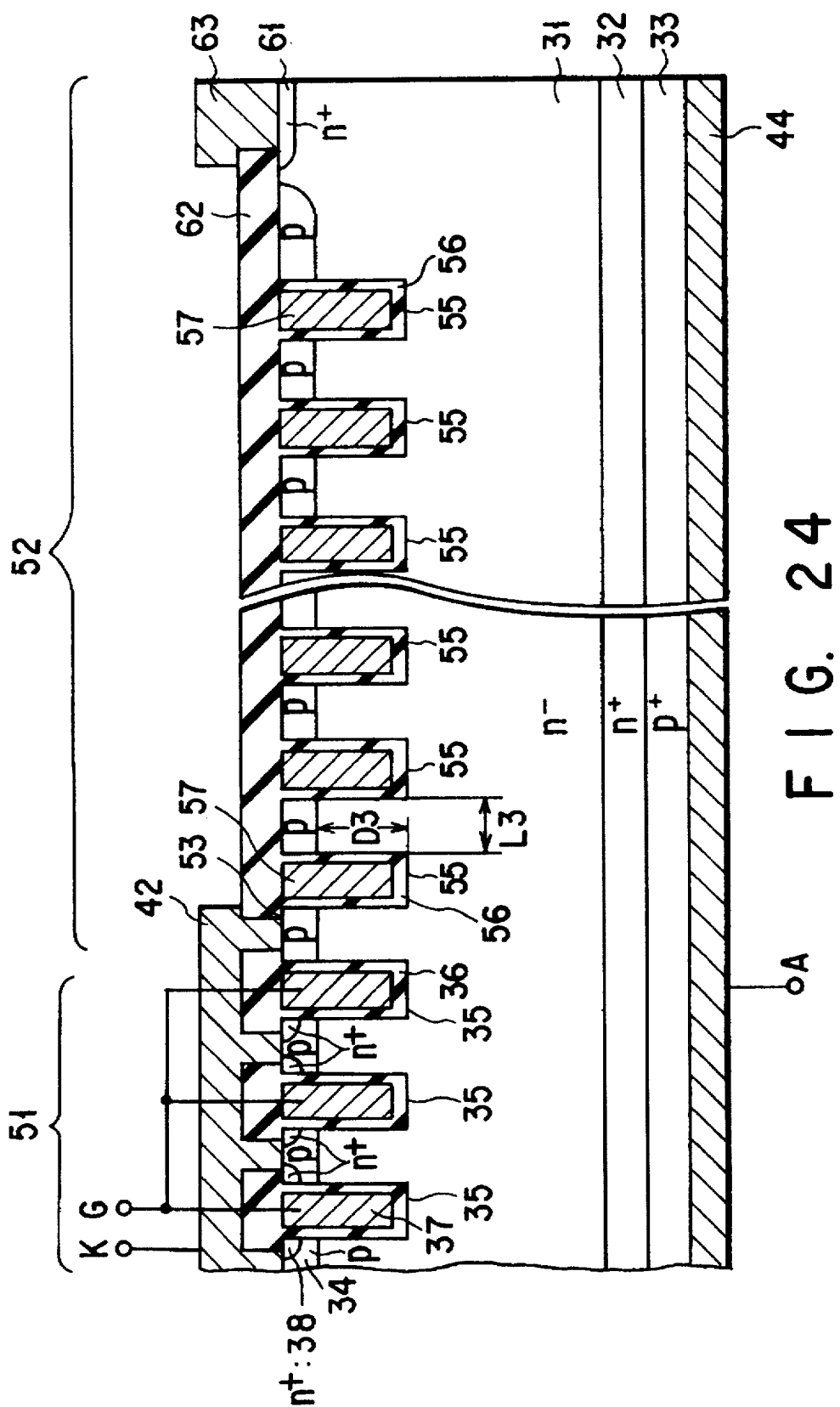
FIG. 24 is a cross sectional view showing a gist part of a power semiconductor device according to still another embodiment of the present invention.

FIG. 24 is a cross sectional view showing a gist part of a power semiconductor device according to still another embodiment of the present invention.

This embodiment is related to a junction termination region 52 formed around a device region 51 of the semiconductor device, which has been described with reference to FIGS. 1 to 23.

As shown in FIG. 24, a p-type emitter layer 33 having a low resistivity is arranged, via an n-type buffer layer 32 having a low resistivity, on a bottom surface of an n-type base layer 31 having a high resistivity. A p-type base layer 34 is formed in a top surface of the n-type base layer 31 by diffusion.

In the device region 51, trenches 35 are formed in the p-type base layer 34 and the n-type base layer 31 such that each trench 35 penetrates the p-type base layer 34 and reaches down to a halfway depth in the n-type base layer 31. The trenches 35 are arranged to form stripes which are parallel at small intervals. A gate electrode 37 is buried via a gate insulating film 36 in the trench 35. An n-type emitter layer 38 having a low resistivity is formed in a surface of the p-type base region 34 so as to be in contact with the upper part of the trench 35.

A cathode electrode 42 is arranged in contact with both the p-type base layer 34 and the n-type emitter layer 38. Further, an anode electrode 44 is arranged in contact with the p-type emitter layer 33.

A plurality of trenches 55, each of which has the shape of a continuous or discontinuous ring, are formed in the junction termination region 52 so as to surround the device region 51. The trenches 55 penetrate the p-type base layer 34 and reach down to a halfway depth in the n-type base layer 31, as the trenches 35 do. A floating electrode 57 is buried via an insulating film 56 in each of the trenches 55. The p-type base layer 34 in the junction termination region 52 is insulated from the device region 51 by the trenches 55.

The number of trenches 55 can be varied, with reference to a necessary breakdown voltage. It is desirable for the distance L3 between two adjacent trenches 55 to be 4 μm or less. It is also desirable for the depth D3 of that part of the trench 55 which is located in the n-type base layer 31 to be greater than the distance L3.

An n-type end layer 61 having a low resistivity is formed in a surface of the n-type base layer 31 at the outer end of the junction termination region 52 so as to surround the trenches 55. An end electrode 63 having the shape of a ring is arranged in contact with the n-type end layer 61. The surface of the junction termination region 52 between the cathode electrode 42 and end electrode 63 is covered with a thick insulating film 62.

In the semiconductor device shown in FIG. 24, if a forward bias voltage is applied between the anode and cathode, a large depletion layer is formed in the n-type base layer 31, thereby causing a high electric field. In this case the electric potential of each trench 55 increases as the distance of the trenches 55 from the cathode electrode 42 increases. As a result, electric field intensity is relaxed at the surface of the semiconductor substrate, thereby protecting the device from breakdown. In other words, if the trenches 55 were to be omitted, most of the equi-potential planes would be concentrated near the end 53 of the cathode electrode 42, thereby breaking down the device.

Figure 25:
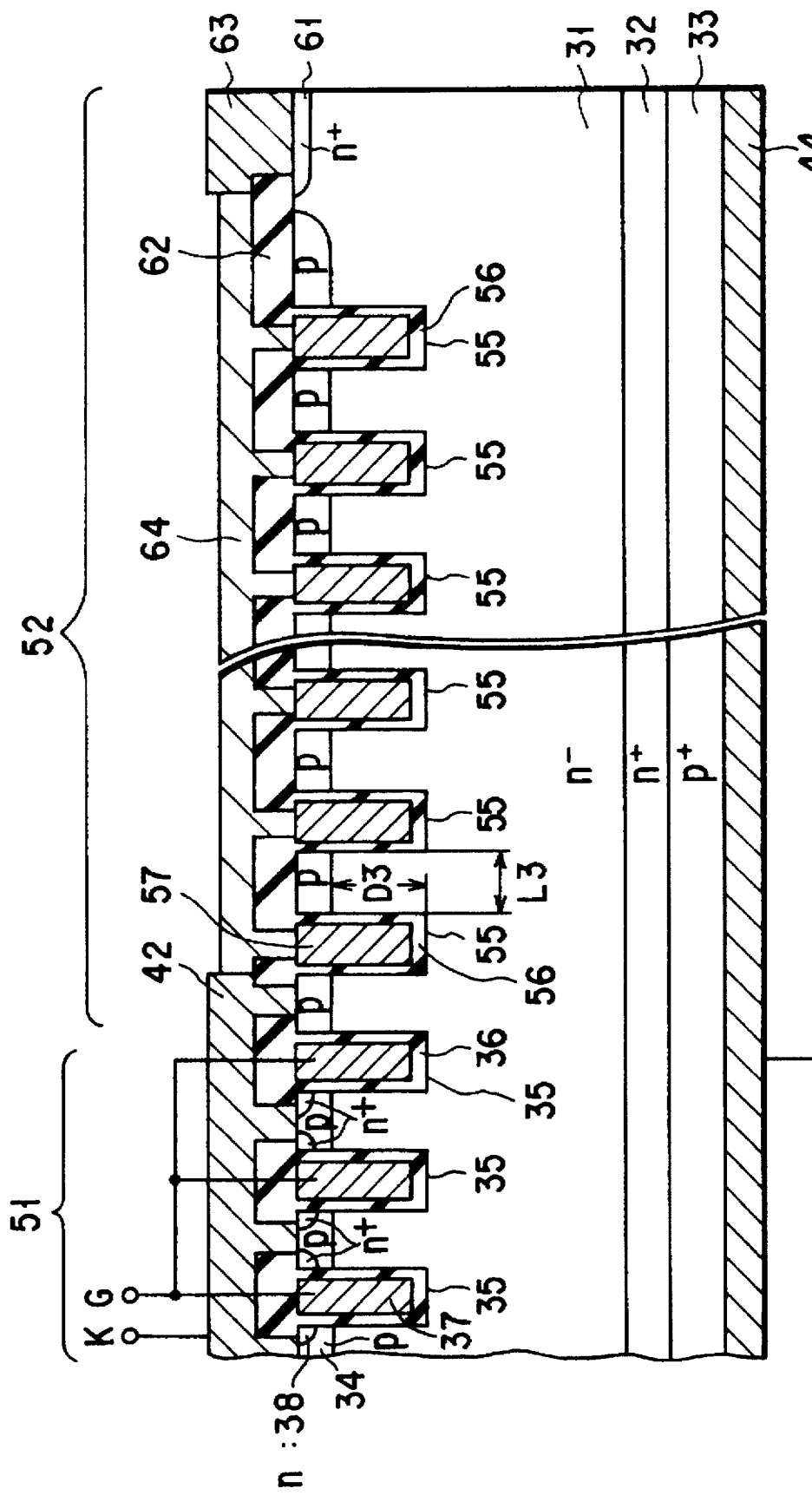
FIG. 25 is a cross sectional view showing a gist part of a power semiconductor device according to still another embodiment of the present invention.

FIG. 25 is a cross sectional view showing a gist part of a power semiconductor device according to still another embodiment of the present invention. The reference numerals used commonly in FIG. 24 and the following drawings denote the same members and, thus, the explanation thereof is omitted in the following description.

The semiconductor device of this embodiment differs from the semiconductor device shown in FIG. 24 in that, in FIG. 25, a high resistance film or semi-insulating film 64 is arranged in contact with the floating electrodes 57, cathode electrode 42, and end electrode 63. The semi-insulating film 64 may be formed of Semi-Insulating Polycrystalline Silicon (SIPOS).

In the semiconductor device shown in FIG. 25, the potentials of the floating electrodes 57 can be gradually increased in order, from the cathode electrode 42 to the end electrode 63. As a result, the semiconductor device is improved in relation to reliability on its breakdown voltage.

Figure 26:
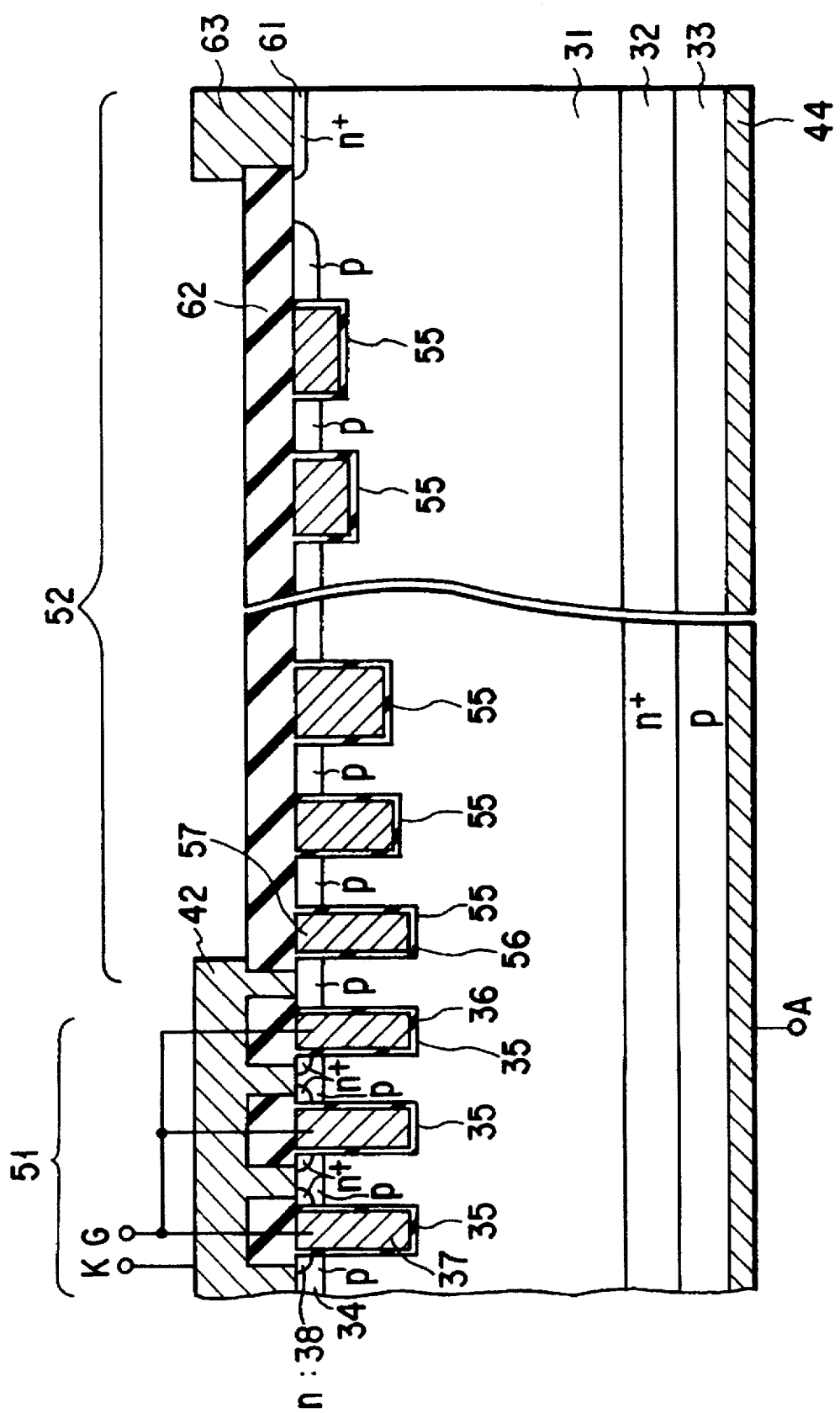
FIG. 26 is a cross sectional view showing a gist part of a power semiconductor device according to still another embodiment of the present invention.
Figure 27:
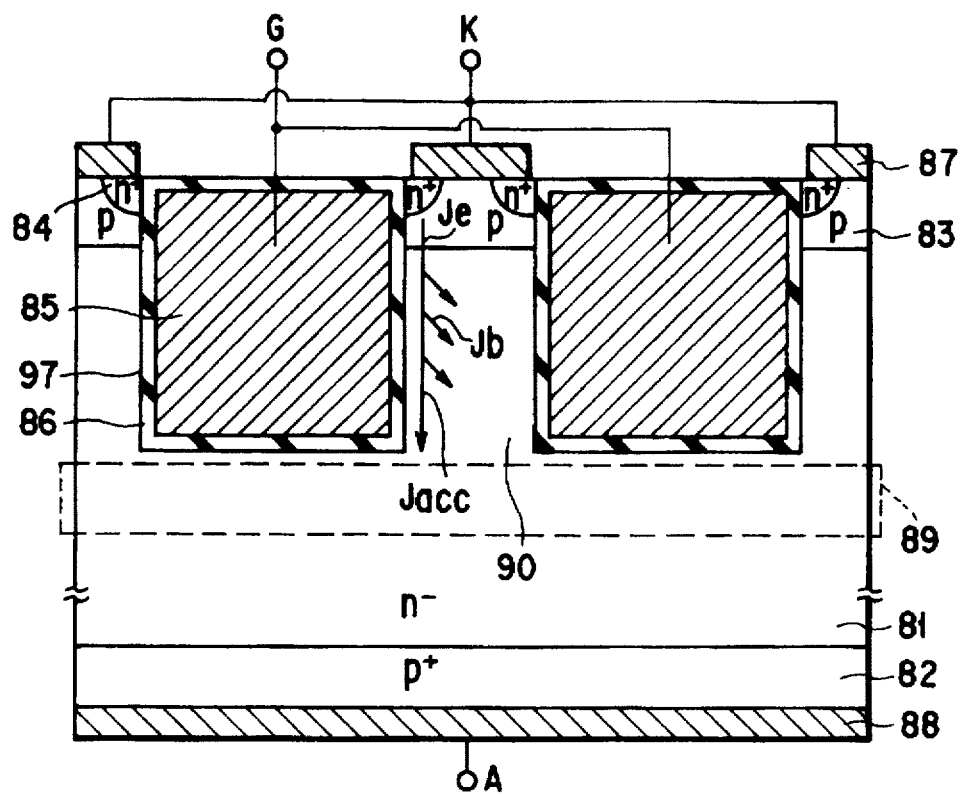
FIG. 27 is a cross sectional view showing a gist part of a conventional power semiconductor device.
Figure 28:
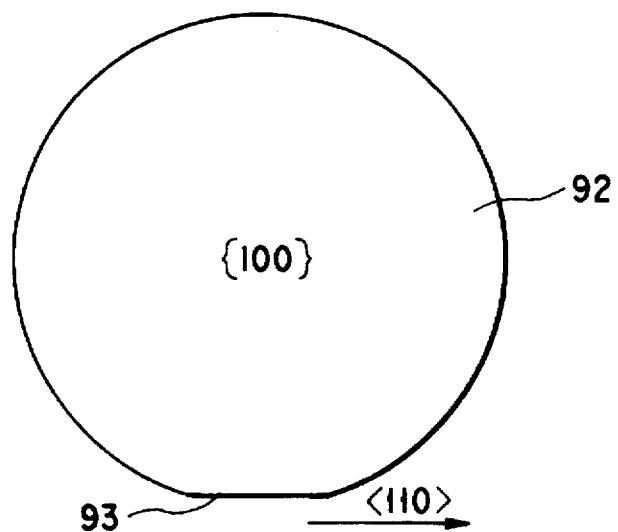
FIG. 28 is a plan view showing a semiconductor substrate used for manufacturing the semiconductor device shown in FIG. 27.

FIG. 26 is a cross sectional view showing a gist part of a power semiconductor device according to still another embodiment of the present invention.

The semiconductor device of this embodiment differs from the semiconductor device shown in FIG. 24 in that, in FIG. 26, the depth of the trenches 55 in the junction termination region 52 is gradually decreased with an increase in the distance of the trenches 55 from the device region 51. This structure can be easily obtained by setting the width of the trenches 55 to be increased with an increase in the distance of the trenches 55 from the device region 51.

In the semiconductor device shown in FIG. 26, since the electric field near the n-type end layer 61 is relaxed, the junction termination region 52 can be formed to have a small length.

It should be noted that the structure of the junction termination region 52 shown in any one of FIGS. 24 to 26 can be applied to a power semiconductor device operating in a IEGT mode, which is obtained by changing parameters of the structure shown in any one of FIGS. 1 to 23, as well as a power diode shown in FIG. 11 or 12.

As has been described above, in the power semiconductor device according to each of the embodiments of the present invention, a {100} plane is dominant in that side surface of each current passage, which faces the gate electrode arranged in a trench. As a result, the amount of carriers to be accumulated in a base layer right under the trench is increased in an on-state, thereby making the conduction loss lower than that of the conventional device.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A power semiconductor device comprising:
   an emitter layer of a first conductivity type;
   a base layer of a second conductivity type arranged on said emitter layer of the first conductivity type, and causing a conductivity modulation in an on-state of the device;
   a base layer of the first conductivity type formed in a surface of said base layer of the second conductivity type;
   a plurality of trenches penetrating said base layer of the first conductivity type and reaching down to a halfway depth in said base layer of the second conductivity type so as to define a plurality of current passages;
   a gate electrode buried in each of said trenches via a gate insulating film;
   an emitter layer of the second conductivity type formed in a surface of said base layer of the first conductivity type within each of said current passages;
   a first main electrode connected to both said emitter layer of the second conductivity type and said base layer of the first conductivity type; and
   a second main electrode connected to said emitter layer of the first conductivity type,
   wherein each of said current passages has a side surface facing said gate electrode such that a {100} plane is dominant in said side surface facing said gate electrode, and wherein, in an on-state of the device, an accumulation layer containing accumulated carriers of the second conductivity type is formed in said side surface within said base layer of the second conductivity type, and carriers of the second conductivity type are injected into a region of said base layer of the second conductivity type under said trenches through said accumulation layer.

2. The power semiconductor device according to claim 1, wherein conditions of X=(Wt+D)/Ws, and X≧5 are satisfied, where D denotes a depth of a portion of each trench which is located in said base layer of the second conductivity type, Ws denotes a width of each current passage, and Wt denotes a distance between adjacent two of said current passages.

3. The power semiconductor device according to claim 1, wherein each of said trenches comprises two trench portions and a dummy inter-trench region arranged between said trench portions and having a surface covered with an insulating film.

4. The power semiconductor device according to claim 1, further comprising a buffer layer of the second conductivity type arranged between said emitter layer of the first conductivity type and said base layer of the second conductivity type.

5. The power semiconductor device according to claim 1, further comprising a low carrier lifetime layer formed in said base layer of the second conductivity type.

6. The power semiconductor device according to claim 1, further comprising a shorting layer of the second conductivity type connecting said base layer of the second conductivity type to said second main electrode.

7. The power semiconductor device according to claim 1, further comprising a ring layer of the first conductivity type arranged in a surface of said base layer of the second conductivity type so as to surround said trenches and said current passages, and to have a depth substantially the same as that of said trenches.

8. The power semiconductor device according to claim 7, wherein said ring layer of the first conductivity type has an average carrier concentration of $1 \times 10^{17}$ cm$^{-3}$ or more.

9. The power semiconductor device according to claim 9, further comprising a gate lead-out electrode arranged via an insulating film on said ring layer of the first conductivity type so as to be connected to said gate electrodes, and a resistance-lowering electrode formed of a metal thin film and arranged on said gate lead-out electrode.

10. The power semiconductor device according to claim 1, further comprising a plurality of end trenches surrounding said trenches and said current passages so as to separate part of said base layer of the first conductivity type located between said end trenches from part of said base layer of the first conductivity type located between said trenches.

11. The power semiconductor device according to claim 10, further comprising an end layer of the second conductivity type having a low resistivity, arranged in a surface of said base layer of the second conductivity so as to surround said end trenches, and an end electrode arranged in contact with said end layer of the second conductivity type.

12. The power semiconductor device according to claim 11, further comprising a floating electrode buried in each of said end trenches via an insulating film, and a semi-insulating film arranged in contact with said floating electrodes, said first main electrode, and said end electrode.

13. The power semiconductor device according to claim 10, wherein depth of said end trenches is decreased with an increase in distance of said end trenches from said current passages.

14. A power semiconductor device comprising:
an emitter layer of a first conductivity type;
a base layer of a second conductivity type arranged on said emitter layer of the first conductivity type, and causing a conductivity modulation in an on-state of the device;
an emitter layer of the second conductivity type formed in a surface of said base layer of the second conductivity type;
a plurality of trenches penetrating said emitter layer of the second conductivity type and reaching down to a halfway depth in said base layer of the second conductivity type so as to define a plurality of current passages;
a gate electrode buried in each of said trenches via a gate insulating film;
a first main electrode connected to said emitter layer of the second conductivity type; and
a second main electrode connected to said emitter layer of the first conductivity type,
wherein each of said current passages has a side surface facing said gate electrode such that a {100} plane is dominant in said side surface facing said gate electrode, and wherein, in an on-state of the device, an accumulation layer containing accumulated carriers of the second conductivity type is formed in said side surface within said base layer of the second conductivity type, and carriers of the second conductivity type are injected into a region of said base layer of the second conductivity type under said trenches through said accumulation layer.

15. The power semiconductor device according to claim 14, wherein each of said trenches comprises two trench portions and a dummy inter-trench region arranged between said trench portions and having a surface covered with an insulating film.

16. The power semiconductor device according to claim 14, further comprising a shorting layer of the first conductivity type connecting said base layer of the second conductivity type to said first main electrode.

17. The power semiconductor device according to claim 14, further comprising a plurality of end trenches surrounding said trenches and said current passages.

18. The power semiconductor device according to claim 17, further comprising an end layer of the second conductivity type having a low resistivity, arranged in a surface of said base layer of the second conductivity so as to surround said end trenches, and an end electrode arranged in contact with said end layer of the second conductivity type.

19. The power semiconductor device according to claim 18, further comprising a floating electrode buried in each of said end trenches via an insulating film, and a semi-insulating film arranged in contact with said floating electrodes, said first main electrode, and said end electrode.

20. The power semiconductor device according to claim 17, wherein depth of said end trenches is decreased with an increase in distance of said end trenches from said current passages.

21. A power semiconductor device comprising;
an emitter layer of a first conductivity type;
a base layer of a second conductivity type arranged on said emitter layer of the first conductivity type, and causing a conductivity modulation in an on-state of the device;
a base layer of the first conductivity type formed in a surface of said base layer of the second conductivity type;

a plurality of trenches penetrating said base layer of the first conductivity type and reaching down to a halfway depth in said base layer of the second conductivity type so as to define a plurality of current passages;

a gate electrode buried in each of said trenches via a gate insulating film;

an emitter layer of the second conductivity type formed in a surface of said base layer of the first conductivity type within each of said current passages;

a first main electrode connected to both said emitter layer of the second conductivity type and said base layer of the first conductivity type; and a second main electrode connected to said emitter layer of the first conductivity type, wherein each of said current passages has a side surface facing said gate electrode such that a {100} plane is dominant in said side surface facing said gate electrode, and wherein, in an on-state of the device, an accumulation layer containing accumulated carriers of the second conductivity type is formed in said side surface within said base layer of the second conductivity type, and carriers of the second conductivity type are injected into a region of said base layer of the second conductivity type under said trenches through said accumulation layer, wherein said base layer of the second conductivity type has an impurity concentration of $2 \times 10^{14}$ cm$^{-3}$ or less.

22. A power semiconductor device comprising:

an emitter layer of a first conductivity type;

a base layer of a second conductivity type arranged on said emitter layer of the first conductivity type, and causing a conductivity modulation in an on-state of the device;

an emitter layer of the second conductivity type formed in a surface of said base layer of the second conductivity type;

a plurality of trenches penetrating said emitter layer of the second conductivity type and reaching down to a halfway depth in said base layer of the second conductivity type so as to define a plurality of current passages;

a gate electrode buried in each of said trenches via a gate insulating film;

a first main electrode connected to said emitter layer of the second conductivity type; and a second main electrode connected to said emitter layer of the first conductivity type, wherein each of said current passages has a side surface facing said gate electrode such that a {100} plane is dominant in said side surface facing said gate electrode, and wherein, in an on-state of the device, an accumulation layer containing accumulated carriers of the second conductivity type is formed in said side surface within said base layer of the second conductivity type, and carriers of the second conductivity type are injected into a region of said base layer of the second conductivity type under said trenches through said accumulation layer, wherein said base layer of the second conductivity type has an impurity concentration of $2 \times 10^{14}$ cm$^{-3}$ or less.

* * * * *